US009257551B2

(12) United States Patent
Kubo

(10) Patent No.: US 9,257,551 B2
(45) Date of Patent: Feb. 9, 2016

(54) SEMICONDUCTOR DEVICE AND METHOD FOR MANUFACTURING SAME

(71) Applicant: RENESAS ELECTRONICS CORPORATION, Kanagawa (JP)

(72) Inventor: Shunji Kubo, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/594,034

(22) Filed: Jan. 9, 2015

(65) Prior Publication Data

US 2015/0115360 A1  Apr. 30, 2015

Related U.S. Application Data

(63) Continuation of application No. 13/985,552, filed as application No. PCT/JP2012/054036 on Feb. 21, 2012, now Pat. No. 8,963,199.

(30) Foreign Application Priority Data

Mar. 18, 2011 (JP) .................................. 2011-061018

(51) Int. Cl.
*H01L 29/66* (2006.01)
*H01L 29/76* (2006.01)
(Continued)

(52) U.S. Cl.
CPC ........ *H01L 29/7816* (2013.01); *H01L 29/0615* (2013.01); *H01L 29/0653* (2013.01);
(Continued)

(58) Field of Classification Search
CPC ..... H01L 21/768; H01L 23/48; H01L 23/548; H01L 23/58; H01L 21/70; H01L 23/147

USPC ......... 257/331–339, 139, 509, 369, 194, 372, 257/355, 329, 347, 409, E21.146, E21.21; 438/270, 135, 297, 268, 141, 201
See application file for complete search history.

(56) References Cited

U.S. PATENT DOCUMENTS 5,304,827 A  4/1994  Malhi et al.
5,382,535 A * 1/1995  Malhi ................. H01L 29/7835
257/E29.268
(Continued)

FOREIGN PATENT DOCUMENTS

CN  1925168 A  3/2007
JP  8-186254 A  7/1996
(Continued)

OTHER PUBLICATIONS

Japanese Office Action issued in Japanese Application No. 2013-505851 dated Sep. 9, 2014, w/English translation.
(Continued)

*Primary Examiner* — Amar Movva
*Assistant Examiner* — Sheikh Maruf
(74) *Attorney, Agent, or Firm* — McDermott Will & Emery LLP

(57) ABSTRACT

An N type well (NW) is formed over a prescribed depth from a main surface of a semiconductor substrate (SUB), and a P type well (PW) and an N type drain region (ND) are formed in the N type well (NW). An N type source region (NS), an N+ type source region (NNS), and a P+ type impurity region (BCR) are formed in the P type well (PW). The N type source region (NS) is formed on a region situated directly below the N+ type source region (NNS), and not on a region situated directly below the P+ type impurity region (BCR), and the P+ type impurity region (BCR) is in direct contact with the P type well (PW).

3 Claims, 34 Drawing Sheets

(51) Int. Cl.
*H01L 29/78* (2006.01)
*H01L 29/06* (2006.01)
*H01L 29/08* (2006.01)
*H01L 29/10* (2006.01)
*H01L 29/423* (2006.01)

(52) U.S. Cl.
CPC ........ *H01L29/0692* (2013.01); *H01L 29/0696* (2013.01); *H01L 29/086* (2013.01); *H01L 29/0847* (2013.01); *H01L 29/0865* (2013.01); *H01L 29/1095* (2013.01); *H01L 29/66659* (2013.01); *H01L 29/66689* (2013.01); *H01L 29/7835* (2013.01); *H01L 29/0878* (2013.01); *H01L 29/1045* (2013.01); *H01L 29/4238* (2013.01); *H01L 29/42368* (2013.01)

(56) References Cited

U.S. PATENT DOCUMENTS

| | | | |
|---|---|---|---|
| 6,215,138 | B1 | 4/2001 | Takao |
| 2002/0030225 | A1* | 3/2002 | Nakamura .......... H01L 29/0615 257/338 |
| 2002/0050618 | A1* | 5/2002 | Nishibe ............... H01L 29/7835 257/368 |
| 2003/0168712 | A1* | 9/2003 | Shin ...................... H01L 21/761 257/510 |
| 2005/0110078 | A1* | 5/2005 | Shino ...................... H01L 21/84 257/331 |
| 2007/0052016 | A1* | 3/2007 | Otake ................. H01L 29/0878 257/335 |
| 2007/0148874 | A1* | 6/2007 | Nitta ....................... H01L 21/84 438/268 |
| 2008/0001185 | A1* | 1/2008 | Kanda ................. H01L 29/1095 257/270 |
| 2012/0037986 | A1* | 2/2012 | Kim .................... H01L 29/7816 257/336 |
| 2014/0008718 | A1* | 1/2014 | Toyoda ........... H01L 21/823412 257/330 |
| 2014/0151794 | A1* | 6/2014 | Lotfi ................... H01L 23/4824 257/337 |
| 2014/0197491 | A1* | 7/2014 | Yamaji ................. H01L 21/266 257/355 |

FOREIGN PATENT DOCUMENTS

| | | |
|---|---|---|
| JP | 11-307763 A | 11/1999 |
| JP | 2000-232224 A | 8/2000 |
| JP | 2006-66439 A | 3/2006 |
| JP | 2007-067127 A | 3/2007 |
| JP | 2008-010628 A | 1/2008 |
| JP | 2009-239096 A | 10/2009 |
| JP | 05-267652 B2 | 8/2013 |
| WO | 2011/027831 A1 | 3/2011 |

OTHER PUBLICATIONS

Chinese Office Action issued in corresponding Chinese Patent Application No. 2012800138551, mailed on Sep. 28, 2015; with English translation.

* cited by examiner

FIG.6
(A)
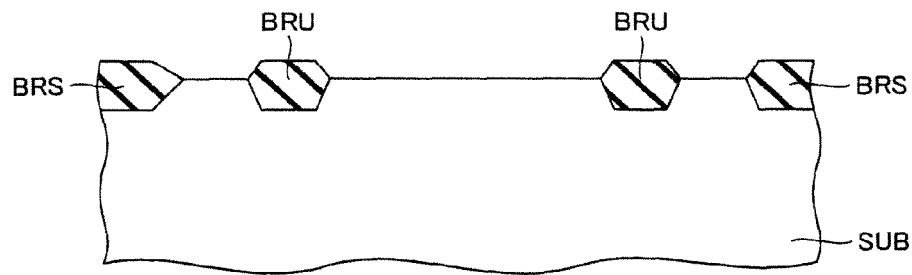
(B)
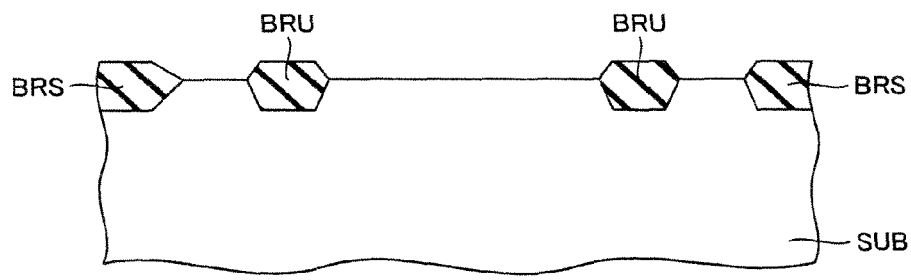
(C)
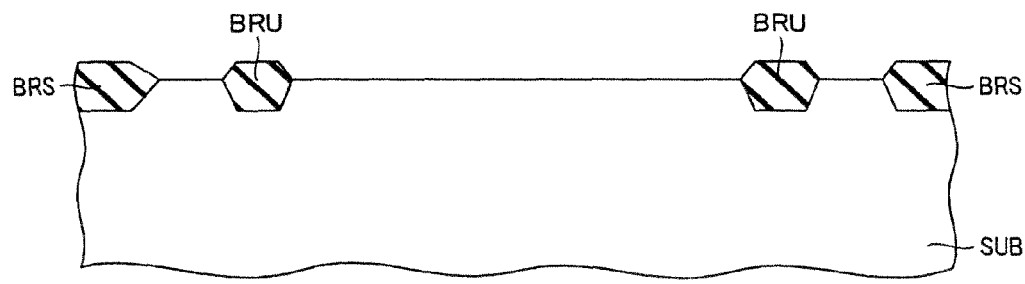

FIG.7
(A)
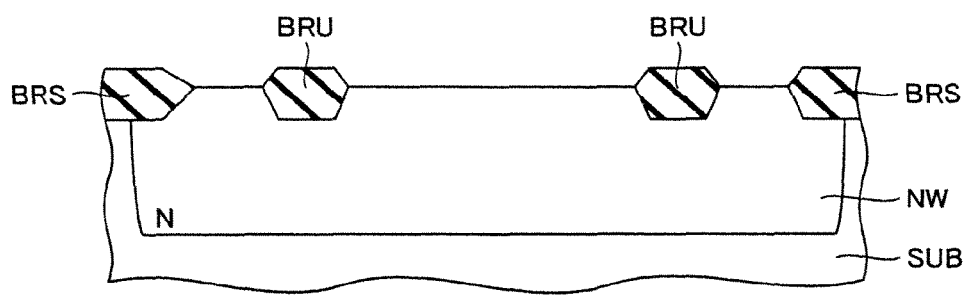
(B)
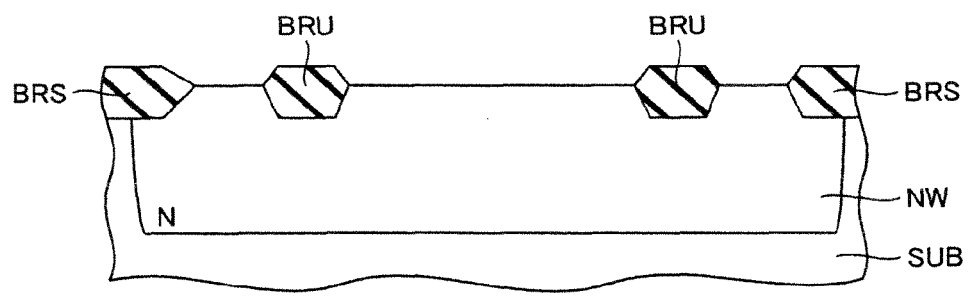
(C)
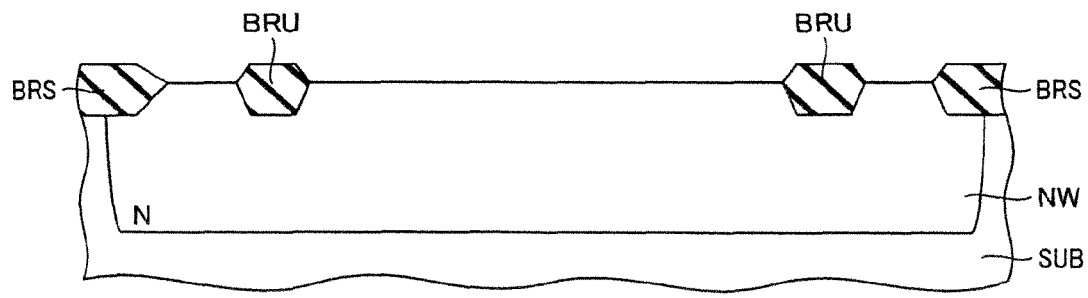

FIG. 8
(A)
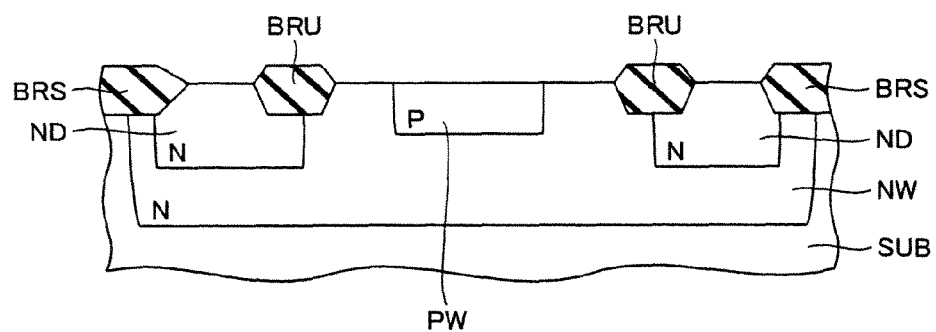
(B)
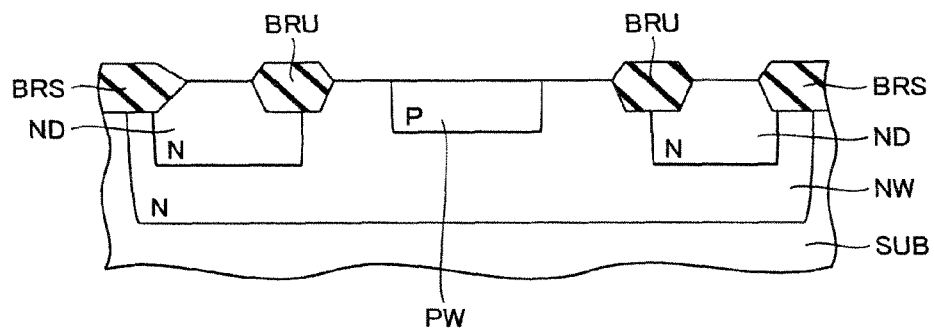
(C)
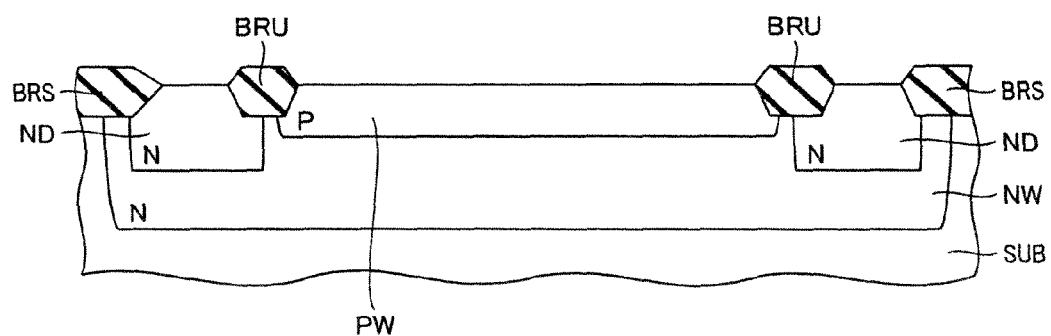

FIG.9
(A)
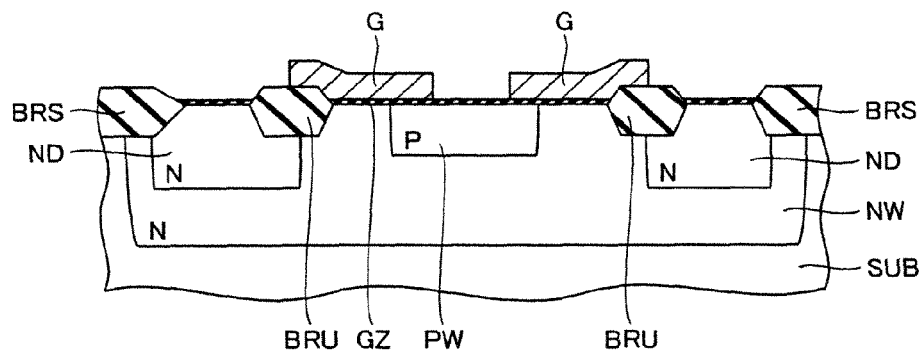
(B)
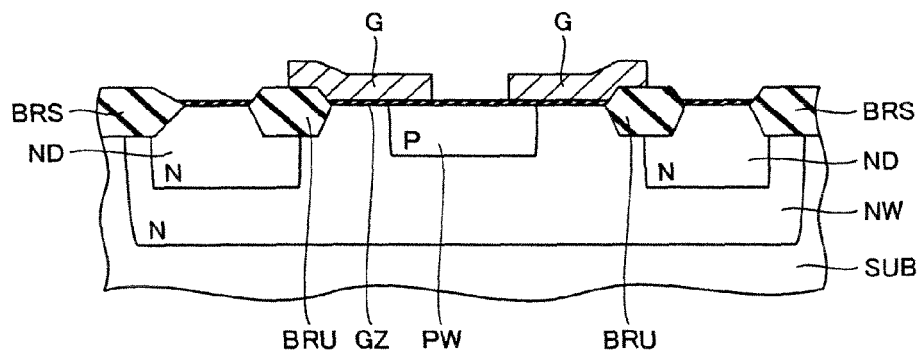
(C)
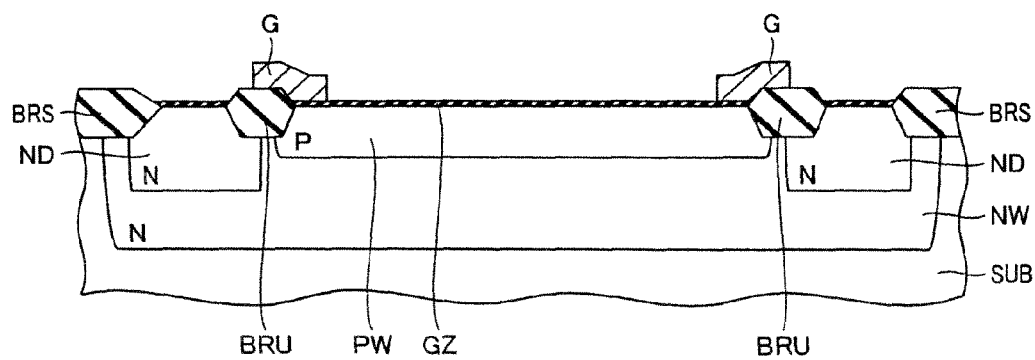

FIG. 10
(A)
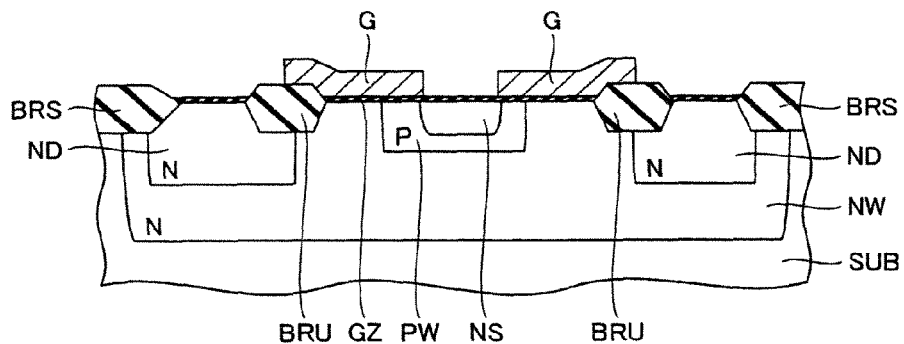
(B)
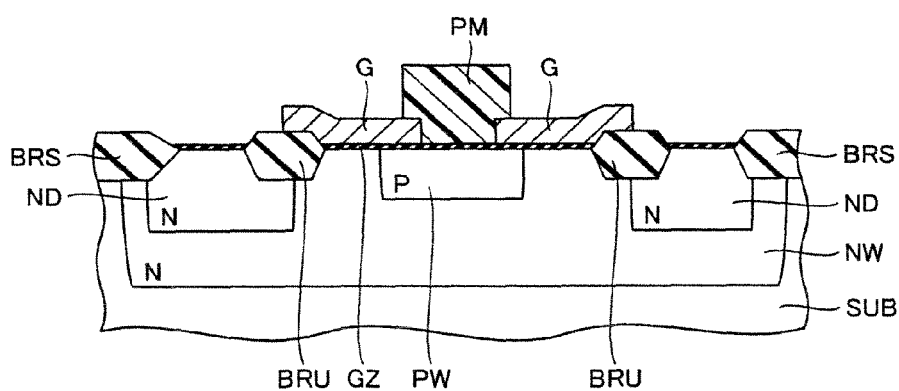
(C)
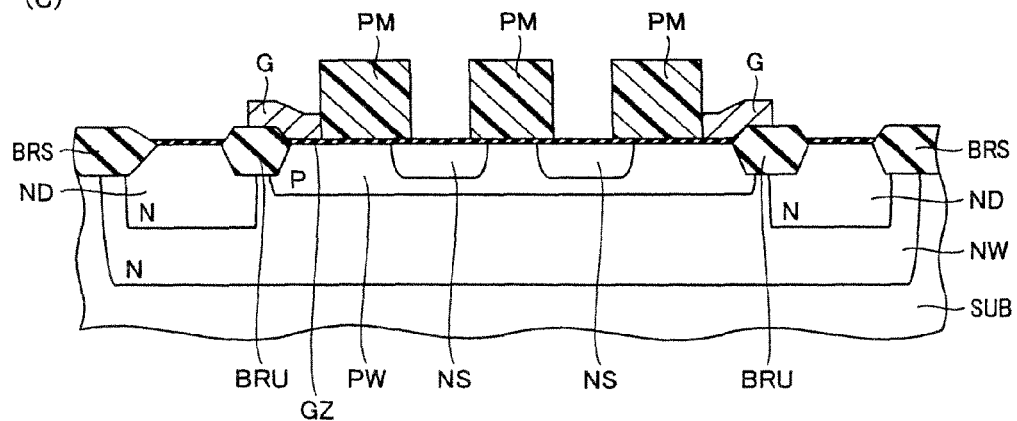

FIG.11
(A)
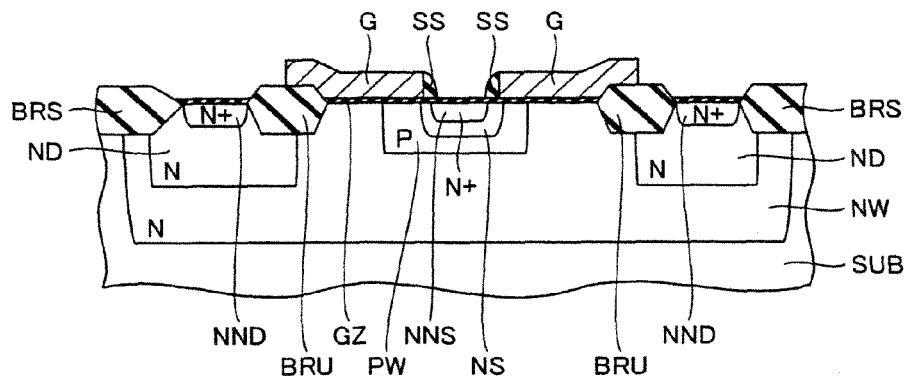
(B)
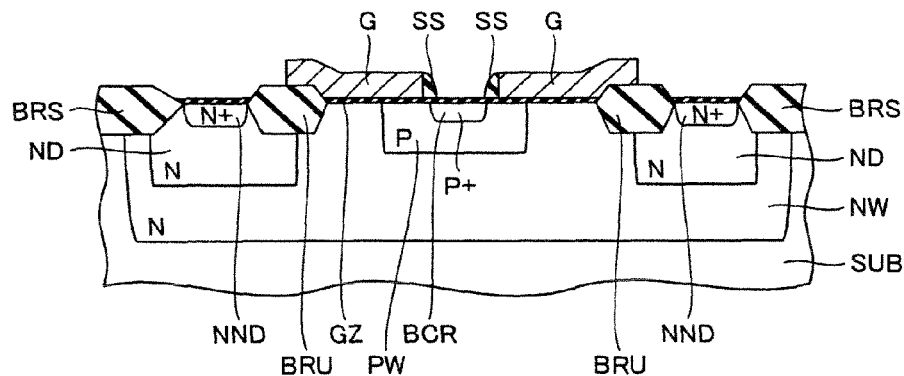
(C)
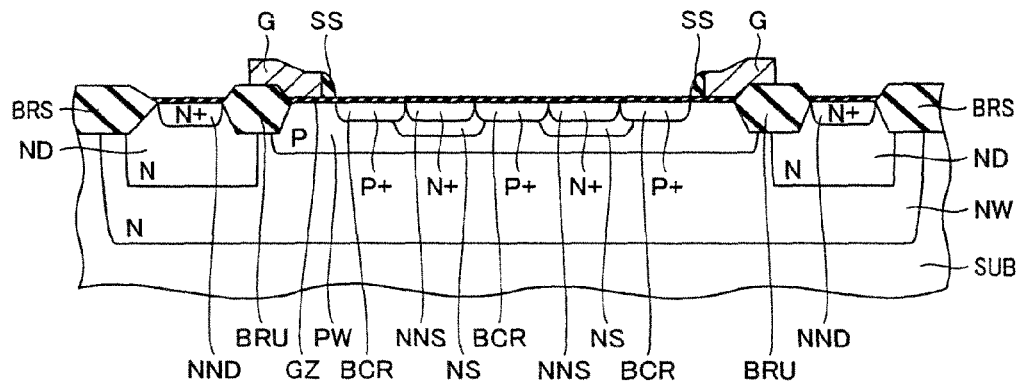

FIG.34
(A)
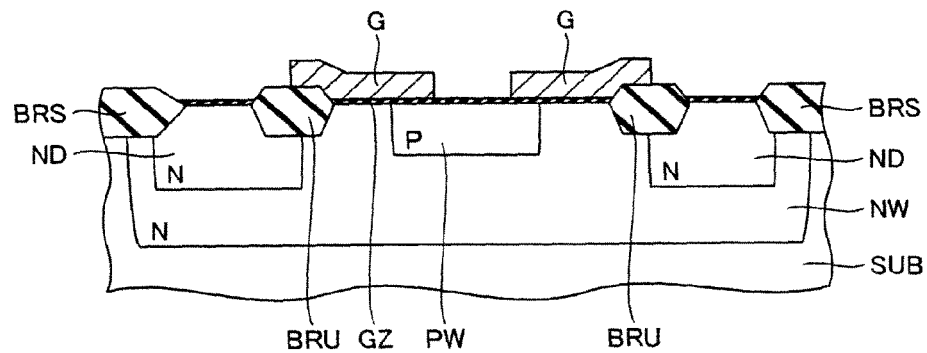
(B)
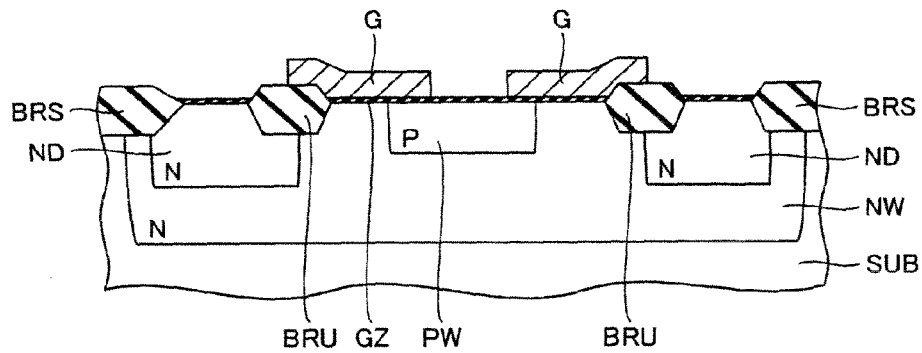
(C)
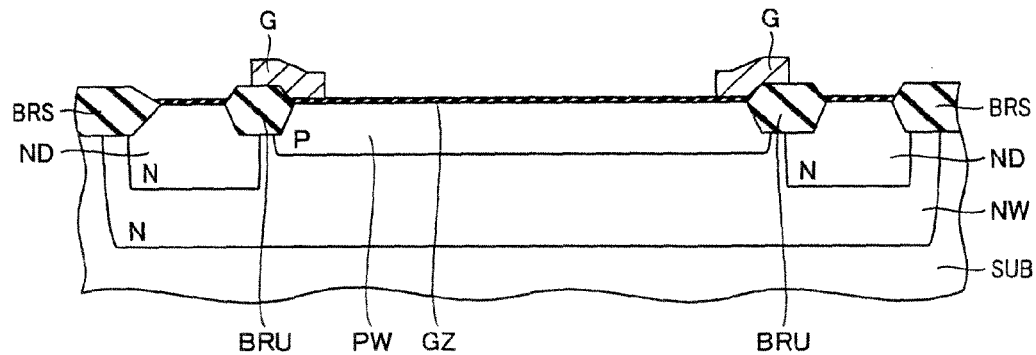

FIG.35
(A)
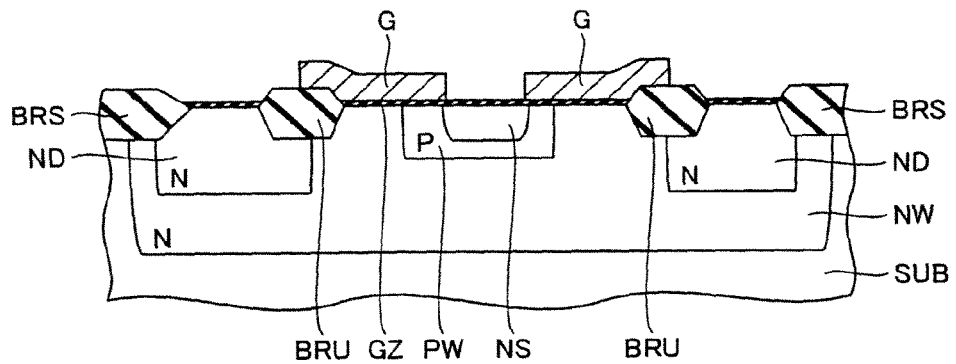
(B)
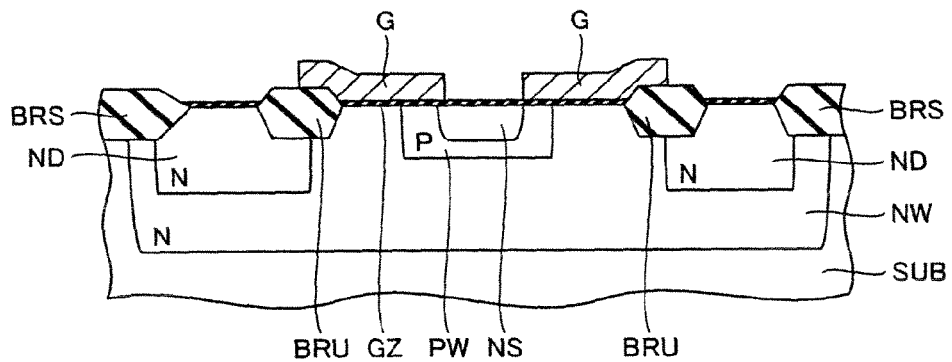
(C)
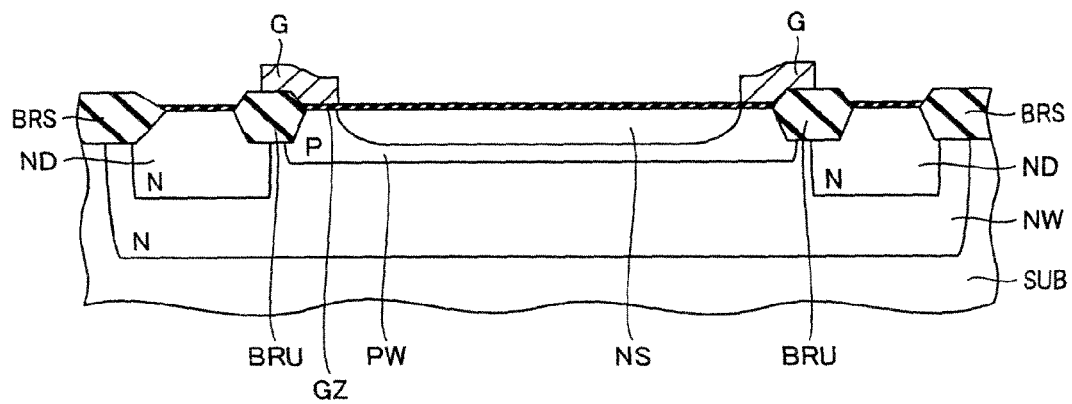

FIG.36
(A)
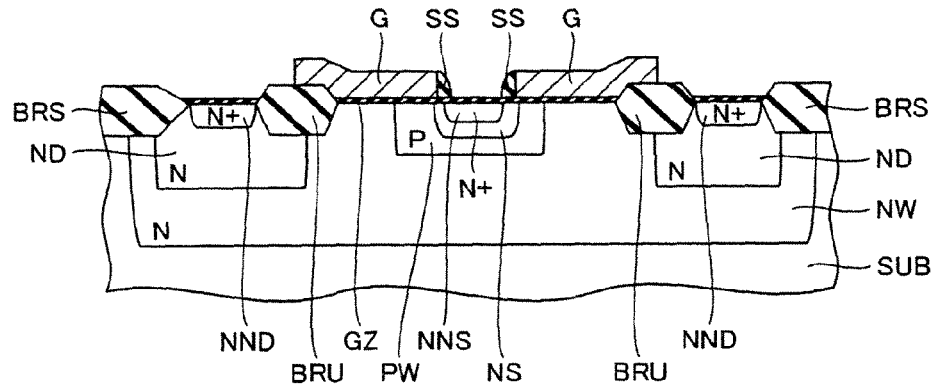
(B)
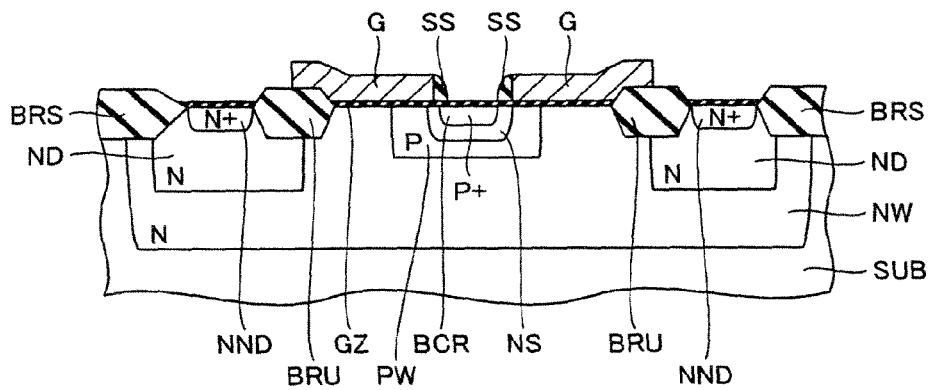
(C)
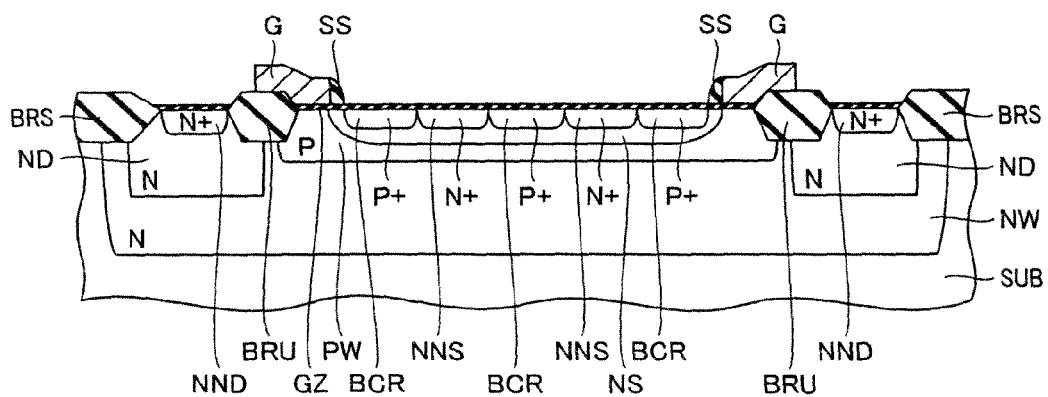

FIG.37
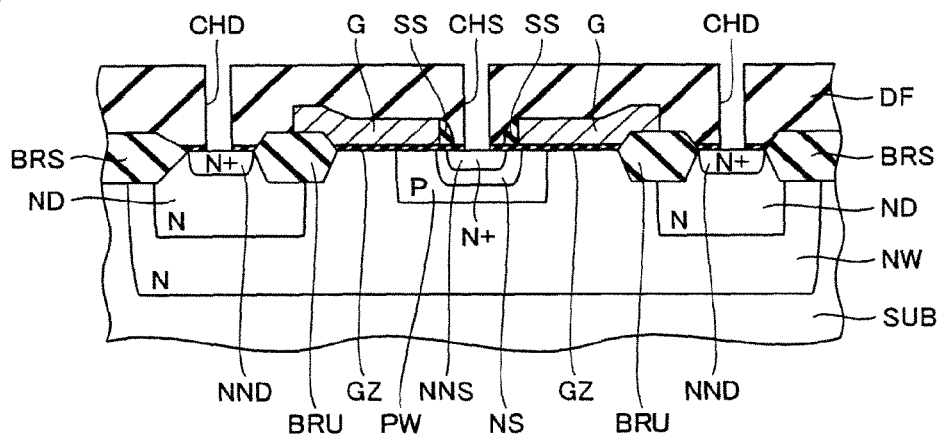
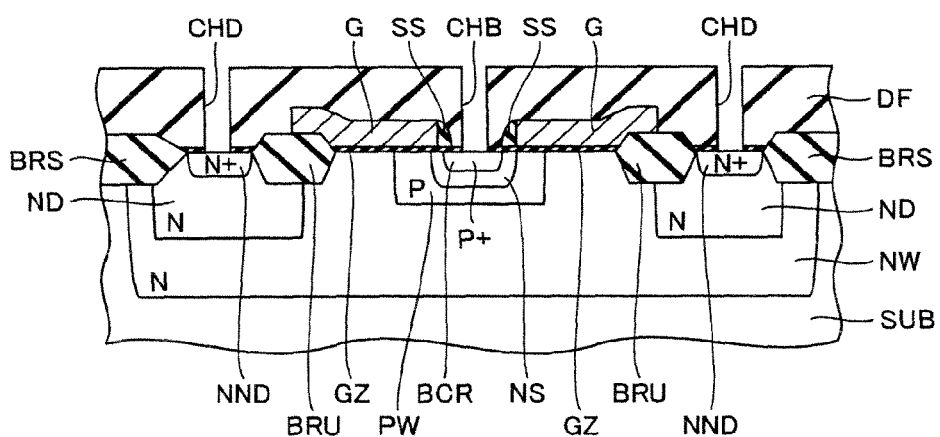
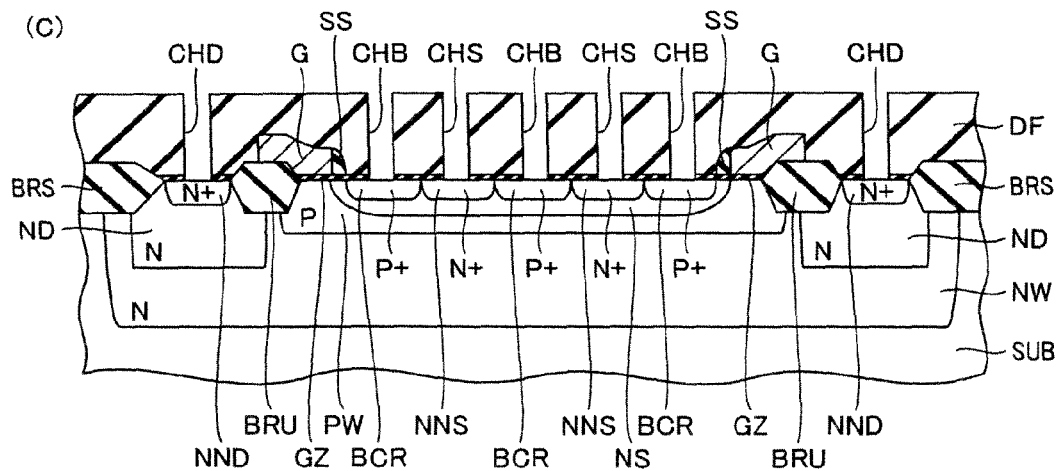

SEMICONDUCTOR DEVICE AND METHOD FOR MANUFACTURING SAME

RELATED APPLICATIONS

This application is a Continuation of U.S. application Ser. No. 13/985,552 filed Aug. 14, 2013, which is the U.S. National Phase under 35 U.S.C. §371 of International Application No. PCT/JP2012/054036, filed on Feb. 21, 2012, which in turn claims the benefit of Japanese Patent Application No. 2011-061018, filed on Mar. 18, 2011, the disclosures of which Applications are incorporated by reference herein.

TECHNICAL FIELD

The present invention relates to a semiconductor device and a method for manufacturing the same, and particularly to a semiconductor device with a field effect transistor having a high breakdown voltage and a method for manufacturing such a semiconductor device.

BACKGROUND ART

A semiconductor device with a field effect transistor having a high breakdown voltage is used as an IC (Integrated Circuit) for controlling an LED (Light Emitting Diode) or an IC for controlling a power supply. As such a field effect transistor having a high breakdown voltage, an N channel-type field effect transistor with an N type well that is applied to a high voltage-side (high-side) will now be described.

An N type well is formed over a prescribed depth from a main surface of a semiconductor substrate (P type), and a P type well is formed in the N type well over a prescribed depth from a surface thereof. An N type source region is formed in the P type well over a prescribed depth from a surface thereof. N type drain region is formed to surround the P type well in a prescribed region of the N type well at a distance from the P type well, over a prescribed depth from a surface thereof. On a portion of the P type well and a portion of the N type well lying between the source region and the drain region, a gate electrode is formed with a gate insulating film interposed therebetween.

Moreover, a P type back gate contact region is formed in the P type well over a prescribed depth from a surface thereof, in order to keep the threshold voltage that is to be applied to the gate electrode for forming a channel, at a constant level. Within the P type well, N type source regions and P type back gate contact regions are arranged alternately in one direction (gate width direction).

In the N channel-type field effect transistor described above, when a voltage equal to or higher than the prescribed threshold voltage is applied to the gate electrode, a channel is formed in a portion of the P type well situated directly below the gate electrode, which causes a current to flow from the source toward the drain. Examples of documents disclosing field effect transistors having high breakdown voltages include Japanese Patent Laying-Open No. 05-267652 (Patent Document 1), Japanese Patent Laying-Open No. 2008-10628 (Patent Document 2), and Japanese Patent Laying-Open No. 11-307763 (Patent Document 3).

CITATION LIST

Patent Document

PTD 1: Japanese Patent Laying-Open No. 05-267652
PTD 2: Japanese Patent Laying-Open No, 2008-10628
PTD 3: Japanese Patent Laying-Open No. 11-307763

SUMMARY OF INVENTION

Technical Problem

Such conventional semiconductor devices, however, had the following problem. In a field effect transistor, an N-impurity region having an impurity concentration lower than that of an N type impurity region is formed to surround the N type impurity region in each of the source region and the drain region, in order to provide measures against hot carriers and alleviate an electric field.

Although the impurity concentration of this N-impurity region is lower than that of the P type back gate contact region, the N-impurity region is formed to reach a position deeper than the back gate contact region. The N-impurity region is thus positioned as a high-resistance region between the P type back gate contact region and the P type well region. Therefore, even if a voltage of 0 V is applied to the back gate contact region in an attempt to fix the potential of the P type well to 0 V, the potential of the P type well may float.

If the potential of the P type well floats, when a prescribed voltage is applied to the gate electrode of the N channel-type field effect transistor and a high voltage is applied to the drain electrode, a parasitic bipolar transistor may operate in which the N type source region serves as an emitter, the P type back gate contact region as a base, and the N type drain region as a collector. This causes a sharp increase in the drain current, which may lead to junction destruction.

The present invention was made to solve the above-described problem. An object of the invention is to provide a semiconductor device in which junction destruction caused by a parasitic bipolar transistor is suppressed, and another object is to provide a method for manufacturing such a semiconductor device.

Solution to Problem

A semiconductor device according to one embodiment of the present invention includes a semiconductor substrate of a first conductivity type having a main surface, a first impurity region of a first conductivity type, a second impurity region of a second conductivity type, a third impurity region of the second conductivity type, a fourth impurity region of the first conductivity type, a fifth impurity region of the second conductivity type, and an electrode portion. The first impurity region of the first conductivity type is formed over a prescribed depth from the main surface of the semiconductor substrate, and has a first impurity concentration. The second impurity region of the second conductivity type is formed over a prescribed depth from a surface of the first impurity region to be surrounded by the first impurity region on side and lower portions, and has a second impurity concentration. The third impurity region of the second conductivity type is formed over a prescribed depth from a surface of the second impurity region to be surrounded by the second impurity region on side and lower portions, and has a third impurity concentration higher than the second impurity concentration. The fourth impurity region of the first conductivity type is formed over a prescribed depth from the surface of the first impurity region to be surrounded by the first impurity region on side and lower portions and in direct contact with the first impurity region, and has a fourth impurity concentration higher than the first impurity concentration. The fifth impurity region of the second conductivity type is formed over a prescribed depth from the main surface of the semiconductor substrate at a distance from the first impurity region. The electrode portion is formed on a region lying between the second impurity region and the fifth impurity region. A plurality of the fourth impurity regions are formed. The plurality of the fourth impurity regions are arranged at a distance from one other in a direction intersecting with a direction of current that is allowed to flow between the second impurity region and the fifth impurity region by application of a prescribed voltage to the electrode portion.

A semiconductor device according to another embodiment of the present invention includes a semiconductor substrate of a first conductivity type having a main surface, a first impurity region of a first conductivity type, a second impurity region of a second conductivity type, a third impurity region of the second conductivity type, a fourth impurity region of the first conductivity type, an isolation region, a fifth impurity region of the second conductivity type, and an electrode portion. The first impurity region of the first conductivity type is formed over a prescribed depth from the main surface of the semiconductor substrate, and has a first impurity concentration. The second impurity region of the second conductivity type is formed over a prescribed depth from a surface of the first impurity region to be surrounded by the first impurity region on side and lower portions, and has a second impurity concentration. The third impurity region of the second conductivity type is formed over a prescribed depth from a surface of the second impurity region to be surrounded by the second impurity region on side and lower portions and in direct contact with the first impurity region, and has a third impurity concentration higher than the second impurity concentration. The fourth impurity region of the first conductivity type is formed over a prescribed depth from the surface of the first impurity region to be surrounded by the first impurity region on side and lower portions, and has a fourth impurity concentration higher than the first impurity concentration. The isolation region is formed between the third impurity region and the fourth impurity region to electrically isolate the third impurity region and the fourth impurity region from each other. The fifth impurity region of the second conductivity type is formed over a prescribed depth from the main surface of the semiconductor substrate at a distance from the first impurity region. The electrode portion is formed on a region lying between the second impurity region and the fifth impurity region.

A method for manufacturing a semiconductor device according to one embodiment of the present invention includes the following steps. A semiconductor substrate of a first conductivity type having a main surface is prepared. A first impurity region of the first conductivity type having a first impurity concentration is formed over a prescribed depth from the main surface of the semiconductor substrate. A second impurity region of a second conductivity type having a second impurity concentration is formed over a prescribed depth from a surface of the first impurity region to be surrounded by the first impurity region on side and lower portions. A third impurity region of the second conductivity type having a third impurity concentration higher than second impurity concentration is formed over a prescribed depth from a surface of the second impurity region to be surrounded by the second impurity region on side and lower portions. A fourth impurity region of the first conductivity type having a fourth impurity concentration higher than the first impurity concentration is formed over a prescribed depth from the surface of the first impurity region to be surrounded by the first impurity region on sick and lower portions and in direct contact with the first impurity region. A fifth impurity region of the second conductivity type is formed over a prescribed depth from the main surface of the semiconductor substrate at a distance from the first impurity region. An electrode portion is formed on a region lying between the second impurity region and the fifth impurity region. In the step of forming the second impurity region, the second impurity region is formed by obliquely implanting an impurity of the second conductivity type into the surface of the semiconductor substrate with a prescribed implantation mask being interposed therebetween. In the step of forming the fourth impurity region, a plurality of the fourth impurity regions are formed at a distance from one another in a direction intersecting with a direction of current that is allowed to flow between the first impurity region and the fifth impurity region by application of a prescribed voltage to the electrode portion.

A method for manufacturing a semiconductor device according to another embodiment of the present invention includes the following steps. A semiconductor substrate of a first conductivity type having a main surface is prepared. A first impurity region of the first conductivity type having a first impurity concentration is formed over a prescribed depth from the main surface of the semiconductor substrate. A second impurity region of a second conductivity type having a second impurity concentration is formed over a prescribed depth from a surface of the first impurity region to be surrounded by the first impurity region on side and lower portions. A third impurity region of the second conductivity type having a third impurity concentration higher than the second impurity concentration is formed over a prescribed depth from a surface of the second impurity region to be surrounded by the second impurity region on side and lower portions. A fourth impurity region of the first conductivity type having a fourth impurity concentration higher than the first impurity concentration is formed over a prescribed depth from the surface of the first impurity region to be surrounded by the first impurity region on side and lower portions and in direct contact with the first impurity region. An isolation region that electrically isolates the third impurity region and the fourth impurity region from each other is formed between the third impurity region and the fourth impurity region. A fifth impurity region of the second conductivity type is formed Over a prescribed depth from the main surface of the semiconductor substrate at a distance from the first impurity region. An electrode portion is formed on a region lying between the second impurity region and the fifth impurity region.

Advantageous Effects of Invention

In each of the semiconductor devices according to one embodiment and another embodiment of the present invention, operation of a parasitic bipolar transistor is suppressed, and junction destruction can be prevented.

With each of the methods for manufacturing a semiconductor device according to one embodiment and another embodiment of the present invention, a semiconductor device can be easily manufactured in which operation of a parasitic bipolar transistor is suppressed and junction destruction can be prevented.

BRIEF DESCRIPTION OF DRAWINGS

FIGS. 6 (A) to (C) are cross-section views showing one step of a method for manufacturing the semiconductor device in the first embodiment, wherein FIG. 6 (A) is a cross-sectional view along a cross-sectional line corresponding to cross-sectional line III-III shown in FIG. 2, FIG. 6 (B) is a cross-sectional view along a cross-sectional line corresponding to cross-sectional line V-V shown in FIG. 2, and FIG. 6 (C) is a cross-sectional view along a cross-sectional line corresponding to cross-sectional line IV-IV shown in FIG. 2.

FIGS. 7 (A) to (C) are cross-sectional views showing a step performed after the step shown in FIG. 6 in the first embodiment, wherein FIG. 7 (A) is a cross-sectional view along a cross-sectional line corresponding to cross-sectional line III-III shown in FIG. 2, FIG. 7 (B) is a cross-sectional view along a cross-sectional line corresponding to cross-sectional line V-V shown in FIG. 2, and FIG. 7 (C) is a cross-sectional view along a cross-sectional line corresponding to cross-sectional line IV-IV shown in FIG. 2.

FIGS. 8 (A) to (C) are cross-sectional views showing a step performed after the step shown in FIG. 7 in the first embodiment, wherein FIG. 8 (A) is a cross-sectional view along a cross-sectional line corresponding to cross-sectional line III-III shown in FIG. 2, FIG. 8 (B) is a cross-sectional view along a cross-sectional line corresponding to cross-sectional line V-V shown in FIG. 2, and FIG. 8 (C) is a cross-sectional view along across-sectional line corresponding to cross-sectional line IV-IV shown in FIG. 2.

FIGS. 9 (A) to (C) are cross-sectional views showing a step performed after the step shown in FIG. 8 in the first embodiment, wherein FIG. 9 (A) is a cross-sectional view along across-sectional line corresponding to cross-sectional line III-III shown in FIG. 2, FIG. 9 (B) is a cross-sectional view along a cross-sectional line corresponding to cross-sectional line V-V shown in FIG. 2, and FIG. 9 (C) is a cross-sectional view along a cross-sectional line corresponding to cross-sectional line IV-IV shown in FIG. 2.

FIGS. 10 (A) to (C) are cross-sectional views showing a step performed after the step shown in FIG. 9 in the first embodiment, wherein FIG. 10 (A) is a cross-sectional view along a cross-sectional line corresponding to cross-sectional line III-III shown in FIG. 2, FIG. 10 (B) is a cross-sectional view along a cross-sectional line corresponding to cross-sectional line V-V shown in FIG. 2, and FIG. 10 (C) is a cross-sectional view along a cross-sectional line corresponding to cross-sectional line IV-IV shown in FIG. 2.

FIGS. 11 (A) to (C) are cross-sectional views showing a step performed after the step shown in FIG. 10 in the first embodiment, wherein FIG. 11. (A) is a cross-sectional view along a cross-sectional line corresponding to cross-sectional line III-III shown in FIG. 2, FIG. 11 (B) is a cross-sectional view along a cross-sectional line corresponding to cross-sectional V-V shown in FIG. 2, and FIG. 11 (C) is a cross-sectional view along a cross-sectional line corresponding to cross-sectional line IV-IV shown in FIG. 2.

FIG. 34 is a cross-sectional view showing one step of a method for manufacturing the semiconductor device in the fourth embodiment, wherein FIG. 34 (A) is a cross-sectional view along a cross-sectional line corresponding to cross-sectional line XXXI-XXXI shown in FIG. 30, FIG. 34 (B) is a cross-sectional view along a cross-sectional line corresponding to cross-sectional line XXXII-XXXII shown in FIG. 30, and FIG. 34 (C) is a cross-sectional view along a cross-sectional line corresponding to cross-sectional line XXXIII-XXXIII shown in FIG. 30.

FIGS. 35 (A) to (C) are cross-sectional views showing a step performed after the step shown in FIG. 34 in the fourth embodiment, wherein FIG. 35 (A) is a cross-sectional view along a cross-sectional line corresponding to cross-sectional line XXXI-XXXI shown in FIG. 30, FIG. 35 (B) is a cross-sectional view along a cross-sectional line corresponding to cross-sectional line XXXII-XXXII shown in FIG. 30, and FIG. 35 (C) is a cross-sectional view along a cross-sectional line corresponding to cross-sectional line XXXIII-XXXIII shown in FIG. 30.

FIGS. 36 (A) to (C) are cross-sectional views showing a step performed after the step shown in FIG. 35 in the fourth embodiment, wherein FIG. 36 (A) is a cross-sectional view along a cross-sectional line corresponding to cross-sectional line XXXI-XXXI shown in FIG. 30, FIG. 36 (B) is a cross-sectional view along a cross-sectional line corresponding to cross-sectional line XXXII-XXXII shown in FIG. 30, and FIG. 36 (C) is a cross-sectional view along a cross-sectional line corresponding to cross-sectional line XXXIII-XXXIII shown in FIG. 30.

FIGS. 37 (A) to (C) are cross-sectional views showing a step performed after the step shown in FIG. 36 in the fourth embodiment, wherein FIG. 37 (A) is a cross-sectional view along a cross-sectional line corresponding to cross-sectional line XXXI-XXXI shown in FIG. 30, FIG. 37 (B) is a cross-sectional view along a cross-sectional line corresponding to cross-sectional line XXXII-XXXII shown in FIG. 30, and FIG. 37 (C) is a cross-sectional view along a cross-sectional line corresponding to cross-sectional line XXXIII-XXXIII shown in FIG. 30.

DESCRIPTION OF EMBODIMENTS

Figure 1:
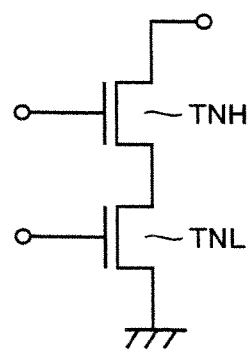
FIG. 1 is a circuit diagram showing an example of a connected form of field effect transistors in a semiconductor device according to each embodiment of the present invention.

Semiconductor devices applied to ICs for controlling power supplies and the like exist in forms that control a plurality of different voltages. As shown in FIG. 1, this type of semiconductor device has a circuit in which N channel-type field effect transistor TNH having a high breakdown voltage that controls a relatively high voltage and an N channel-type field effect transistor TNL having a high breakdown voltage that controls a relatively low voltage are connected in series to each other.

In the N channel-type field effect transistor that controls a high voltage (high-side field effect transistor), an N type well is formed to electrically isolate a source region from the semiconductor substrate. An N type well is not formed, on the other hand, in the N channel-type field effect transistor that controls a low voltage (low-side field effect transistor).

Hereinafter, semiconductor devices with high-side field effect transistors will be described in first to fourth embodiments, and semiconductor devices with low-side field effect transistors will be described in fifth to eighth embodiments.

First Embodiment

A first example of a semiconductor device with a high-side field effect transistor will be described herein. As shown in FIGS. 2, 3, 4 and 5, isolation regions BRU, BRS that define device-forming regions for forming a source region and a drain region, respectively, are formed in prescribed regions in a P type semiconductor substrate SUB. Isolation regions BRU, BRS are each formed of a LOCOS (Local Oxidation of Silicon) oxide film, for example.

An N type well NW having a relatively low impurity concentration (approximately $1 \times 10^{16}/cm^3$) is formed in a region of semiconductor substrate SUB surrounded by isolation region BRS, over a prescribed depth from a surface thereof. In a portion of N type well NW lying between isolation region BRS and isolation region BRU, an N type drain region ND having a relatively high impurity concentration (approximately $3 \times 10^{16}/cm^3$ to $6 \times 10^{16}/cm^3$) is formed over a prescribed depth from a surface of the N type well to be surrounded by N type well NW on side and lower portions.

In a portion of N type well NW situated inward of isolation region BRU, a P type well PW serving as a back gate region, having a prescribed impurity concentration (approximately $3 \times 10^{17}/cm^3$), is formed over a prescribed depth from the surface of the N type well to be surrounded by N type well NW on side and lower portions. An N type source region NS having a relatively low impurity concentration (approximately $1 \times 10^{18}/cm^3$) is formed in P type well PW over a prescribed depth from a surface of the P type well to be surrounded by P type well PW on side and lower portions.

An N+ type source region NNS having a relatively high impurity concentration (approximately $1\times10^{19}/cm^3$) is formed in a portion of N type source region NS over a prescribed depth from a surface of the portion of N+ type source region NS to be surrounded by the N type source region on side and lower portions. A P+ type impurity region BCR serving as a back gate contact region, having a relatively high impurity concentration (approximately $1\times10^{19}/cm^3$), is formed in P type well PW over a prescribed depth from a surface of P type well PW to be surrounded by P type well PW on side and lower portions.

An N+ type drain region NND having a relatively high impurity concentration (approximately $1\times10^{10}/cm^3$) is formed in a portion of N type drain region ND over a prescribed depth from a surface of the portion of N type drain region ND to be surrounded by N type drain region ND on side and lower portions. On a portion of P type well PW and a portion of N type well NW lying between N type source region NS and N type drain region ND, a gate electrode G formed with a gate insulating film GZ interposed therebetween.

An interlayer insulating film OF is formed to cover gate electrode G. Contact holes CHS, CHD, and CHB are formed to penetrate through interlayer insulating film DF. A contact plug CPS, which is electrically connected to N+ type source region NNS, is formed within contact hole CHS. A contact plug CPD, which is electrically connected to N+ type drain region NND, is formed within contact hole CHD. A contact plug CPB, which is electrically connected to P+ type impurity region BCR, is formed within contact hole CHB.

On a surface of interlayer insulating film DF, a metal interconnect MLS electrically connected to contact plug CPS is formed, and a metal interconnect MLD electrically connected to contact plug CPD is also formed. A metal interconnect MLB electrically connected to contact plug CPB is formed as well.

Figure 2:
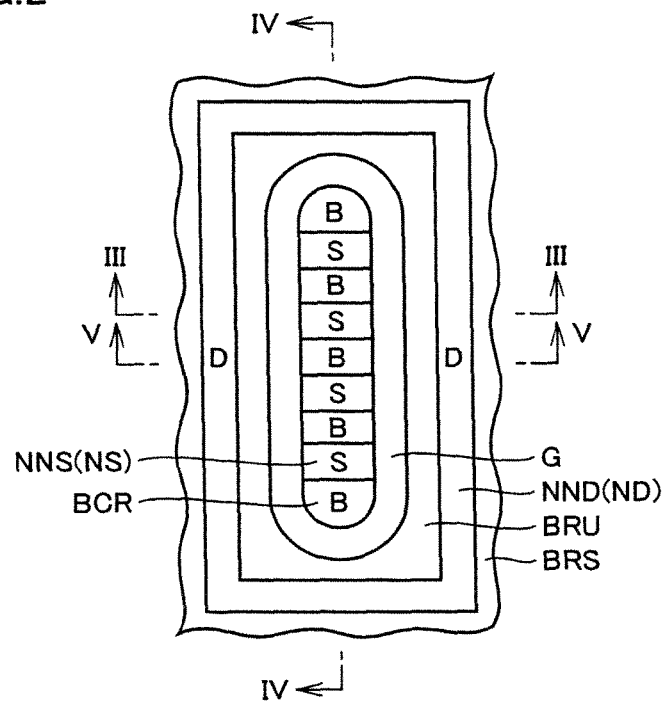
FIG. 2 is a plan view of a semiconductor device according to a first embodiment of the present invention.
Figure 3:
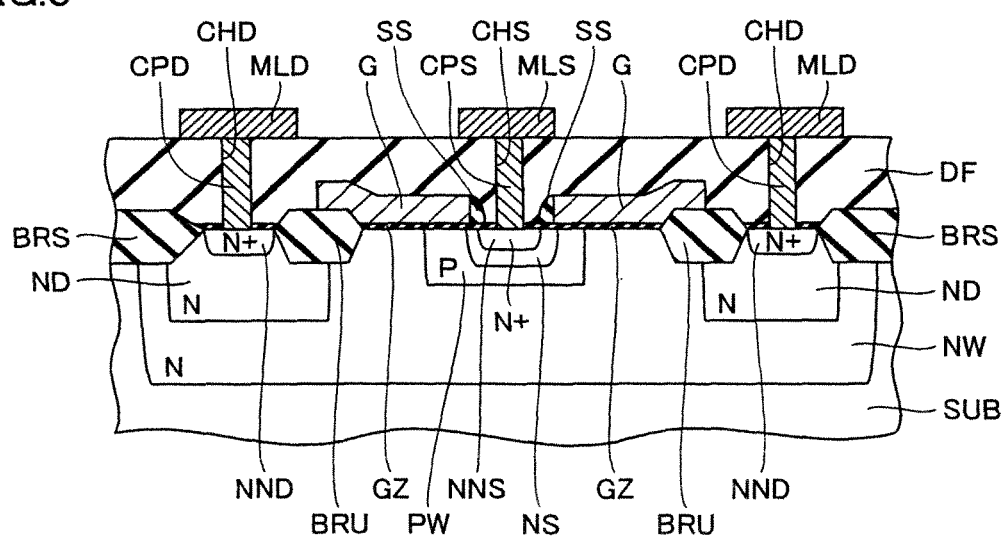
FIG. 3 is a cross-sectional view along a cross-sectional line III-III shown in FIG. 2 in the first embodiment.

As shown in FIG. 2, in this semiconductor device, N type source regions NS and P type wells PW are arranged alternately in a direction intersecting with (substantially orthogonal to) a direction of current flow between N type source region NS and N type drain region ND. Gate electrode G is formed to surround alternately-formed N type source regions NS and P type wells PW.

Figure 4:
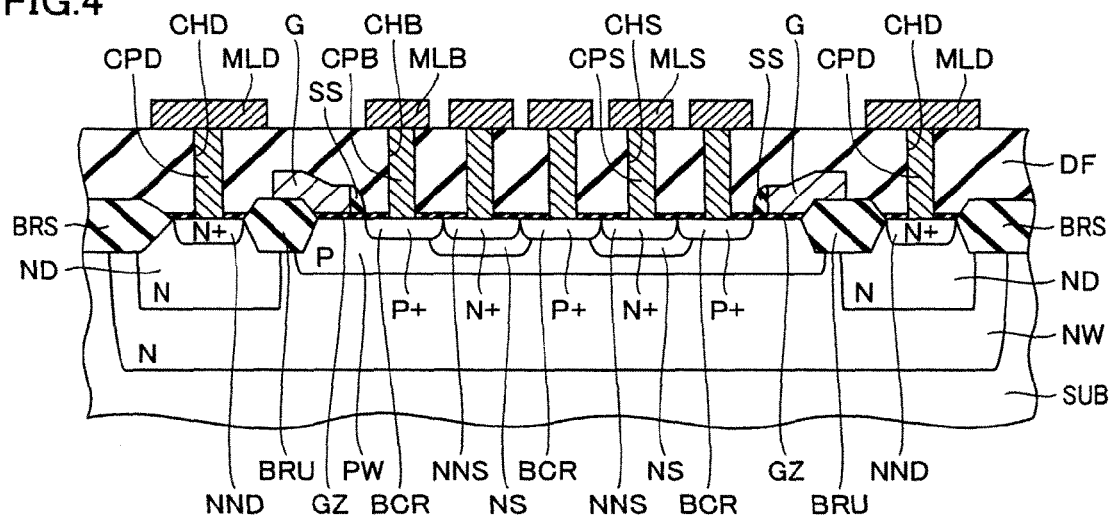
FIG. 4 is a cross-sectional view along a cross-sectional line IV-IV shown in FIG. 2 in the first embodiment.
Figure 5:
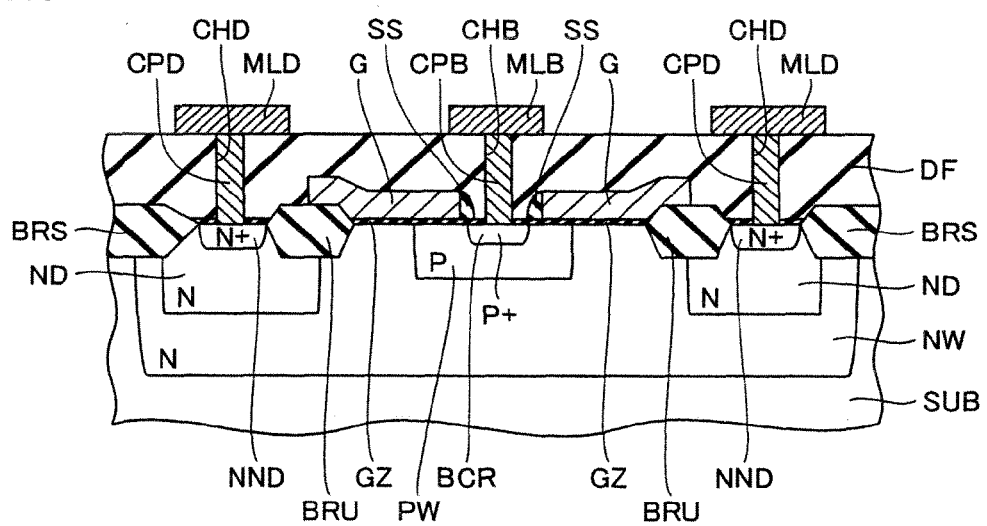
FIG. 5 is a cross-sectional view along a cross-sectional line V-V shown in FIG. 2 in the first embodiment.

Furthermore, as shown in FIGS. 4 and 5, N type source region NS is formed on a portion of P type well PW situated directly below N+ type source region NNS, and not on a portion of P type well PW situated directly below P+ type impurity region BCR. P+ type impurity region BCR serving as the back gate contact region, therefore, is in direct contact with the portion of P type well PW.

Next, an exemplary method for manufacturing the semiconductor device described above will be described. First, as shown in FIGS. 6 (A), (B) and (C), isolation regions BRU and BRS that define device-forming regions for forming, for example, a source region and a drain region, respectively, are formed in prescribed regions in P type semiconductor substrate SUB by the LOCOS method, for example.

Next, a photoresist (not shown) is formed to expose the region of semiconductor substrate SUB surrounded by isolation region BRS. Then, with the photoresist used as a mask, phosphorus, for example, is implanted into the exposed region of semiconductor substrate SUB at a prescribed implanting energy, thereby forming N type well NW over a prescribed depth from the surface of semiconductor substrate SUB, as shown in FIGS. 7 (A), (B) and (C). The photoresist is subsequently removed.

Next, a photoresist (not shown) is formed to expose the portion lying between isolation region BRS and isolation region BRU. Then, with the photoresist used as a mask, phosphorus, for example, is implanted into the exposed portion of N type well NW at a prescribed implanting energy, thereby forming N type drain region ND over a prescribed depth from the surface of N type well NW, as shown in FIGS. (A), (B) and (C). The photoresist is subsequently removed.

Next, a photoresist (not shown) is formed to expose a prescribed region in N type well NW surrounded by isolation region BRU. Then, with the photoresist used as a mask, boron, for example, is implanted into the prescribed exposed region of N type well NW at a prescribed implanting energy, thereby forming P type well PW as a back gate region over a prescribed depth from the surface thereof, as shown in FIGS. 8 (A), (B) and (C). P type well PW is surrounded by N type well NW on side and lower portions thereof, and therefore, serves as a region electrically isolated from semiconductor substrate SUB. The photoresist is subsequently removed.

Next, gate insulating film GZ (see FIG. 9) is formed on surfaces of exposed N type well NW and the like, and a conductive film (not shown) is formed on the gate insulating film. Then, the conductive film is subjected to a prescribed photolithography process and prescribed processing, thereby forming gate electrode G on the portion of N type well NW and the portion of P type well PW lying between P type well PW and N type drain region ND, with gate insulating film GZ interposed therebetween.

Next, as shown in FIGS. 10 (A), (B) and (C), photoresist PM is formed to cover a region on which P+ type impurity region BCR (see FIG. 4) is to be formed, and expose a region on which N+ type source region NNS (see FIG. 3) is to be formed, of the exposed portion of P type well PW that is not covered with gate electrode G. Then, with photoresist PM used as a mask, phosphorus, for example, is implanted obliquely at an inclined angle of about 45° with respect to the surface of semiconductor substrate SUB, thereby forming N type source region NS over a prescribed depth from the surface of exposed P type well PW. Photoresist PM is subsequently removed.

Next, an insulating film (not shown) made of silicon oxide, example, formed to cover gate electrode G; subsequently, anisotropic etching is applied to the entire surface of the insulating film, thereby forming an insulating film spacer SS on a side wall of gate electrode G, as shown in FIGS. 11 (A), (B) and (C). A photoresist (not shown) is then formed to cover the region on which P+ type impurity region BCR (see FIG. 4) is to be formed, and expose the region on which N+ type source region NNS (see FIG. 4) is to be formed.

Then, with the photoresist and gate electrode C) used as masks, arsenic is implanted at a prescribed implanting energy, thereby forming N+ type source region NNS in N type source region NS over a prescribed depth from the surface of N type source region NS to be surrounded by N type source region NS on side and lower portions. N+ type drain region NND is formed in N type drain region ND over a prescribed depth from a surface thereof. The photoresist is subsequently removed.

A photoresist (not shown) is then formed to expose the region on which P+ type impurity region BCR (see FIG. 4) is to be formed, and cover the region on which N+ type source region NNS (see FIG. 4) is to be formed. Then, with the photoresist used as a mask, boron is implanted at a prescribed implanting energy, thereby forming P+ type impurity region BCR as a back gate contact region. The photoresist is subsequently removed.

Figure 12:
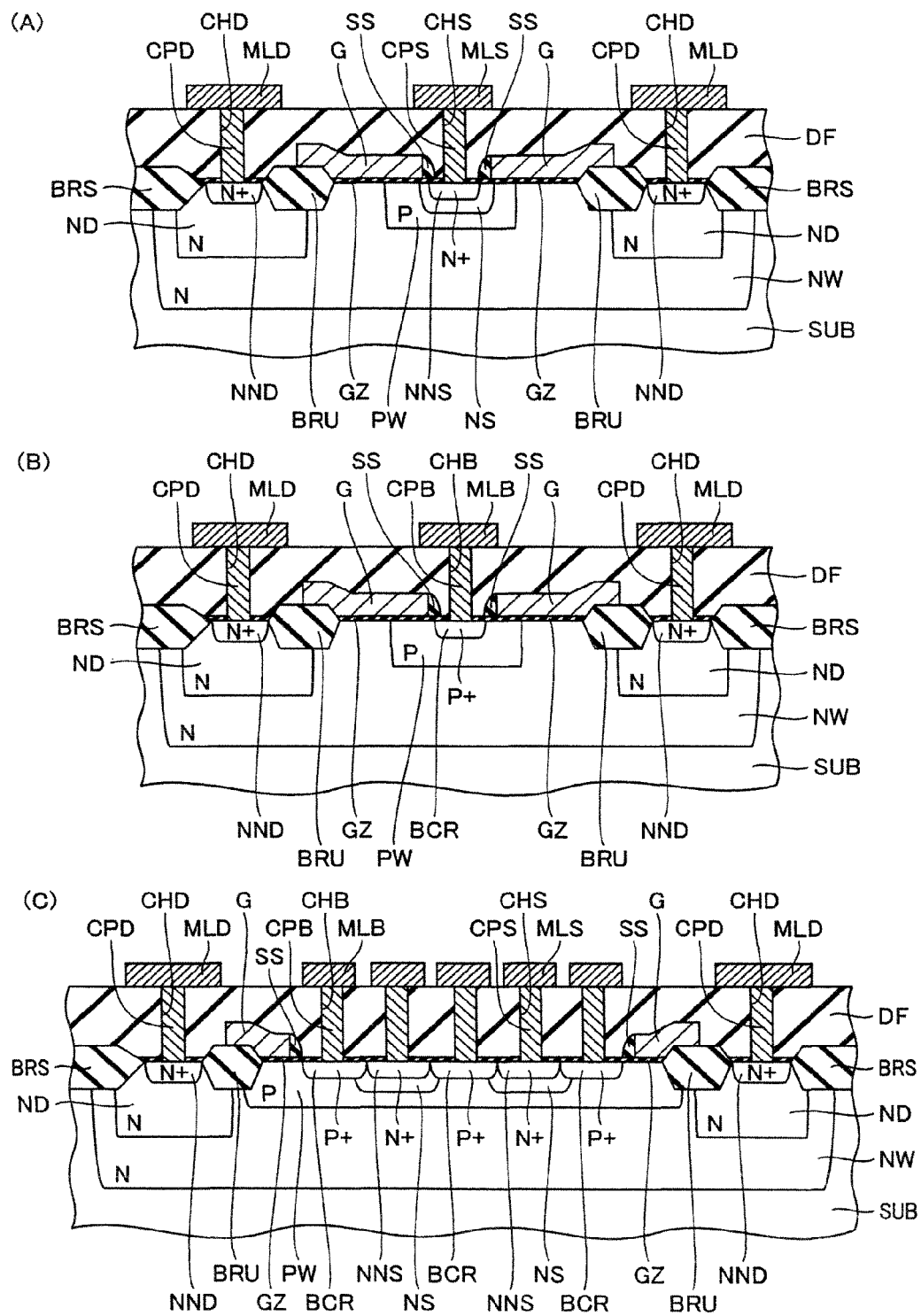
FIGS. 12 (A) to (C) are cross-sectional views showing a step performed after the step shown in FIG. 11 in the first embodiment, wherein FIG. 12 (A) is a cross-sectional view along a cross-sectional line corresponding to cross-sectional line III-III shown in FIG. 2, FIG. 12 (B) is a cross-sectional view along a cross-sectional line corresponding to cross-sectional line V-V shown in FIG. 2, and FIG. 12 (C) is a cross-sectional view along a cross-sectional line corresponding to cross-sectional line IV-IV shown in FIG. 2.
Figure 13:
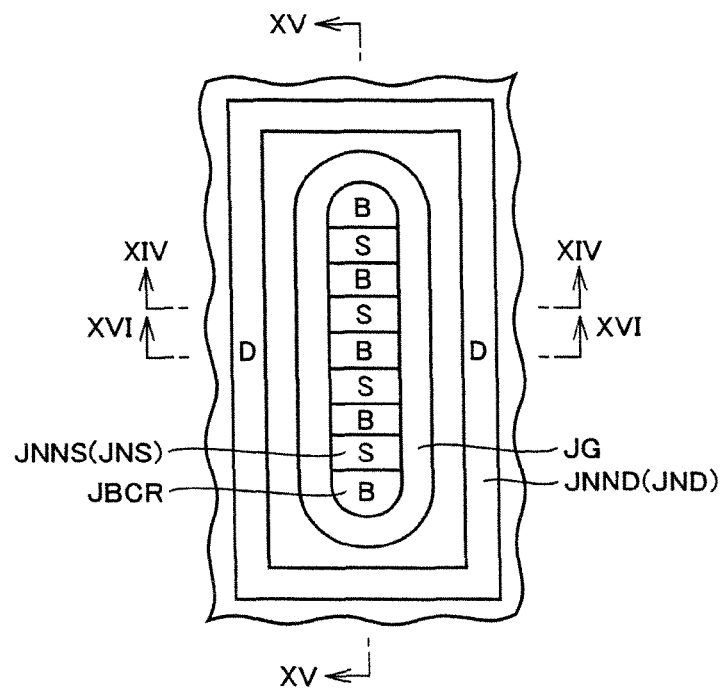
FIG. 13 is a plan view of a semiconductor device according to a comparative example.
Figure 14:
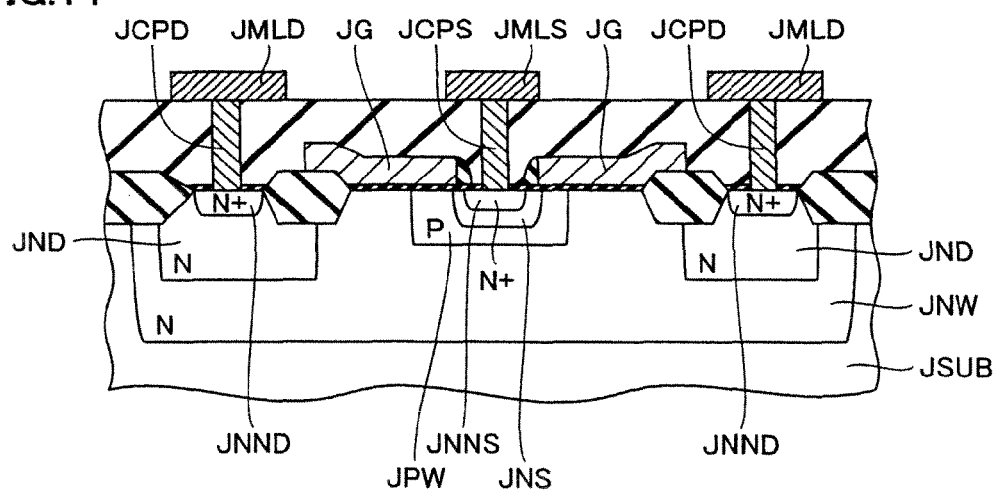
FIG. 14 is a cross-sectional view along a cross-sectional line XIV-XIV shown in FIG. 13.
Figure 15:
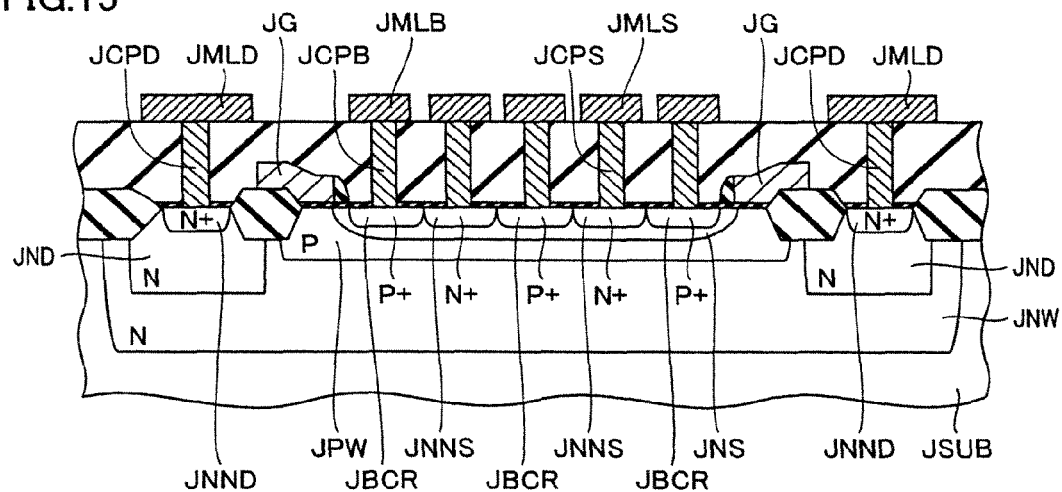
FIG. 15 is a cross-sectional view along a cross-sectional line XV-XV shown in FIG. 13.
Figure 16:
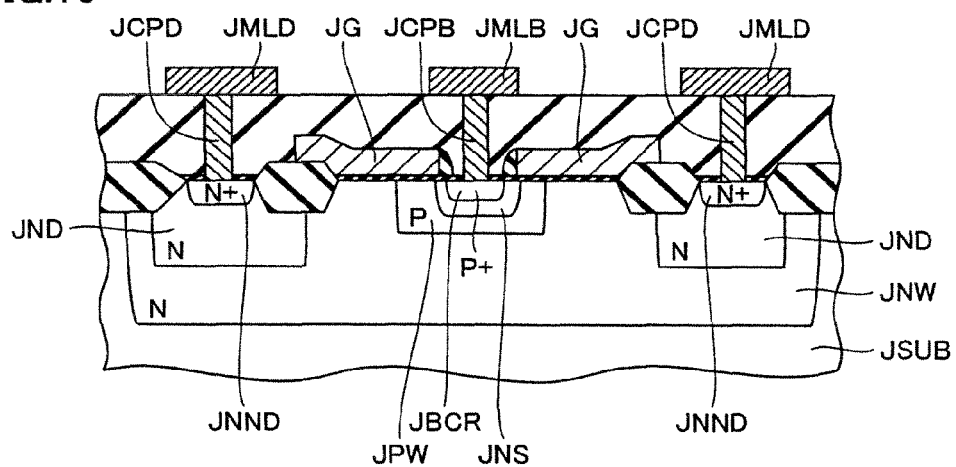
FIG. 16 is a cross-sectional view along a cross-sectional line XVI-XVI shown in FIG. 13.

Next, as shown in FIGS. 12 (A), (B) and (C), interlayer insulating film DF is formed to cover gate electrode G and the like. Contact holes CHS, CHD and CHB (see FIG. 12) that expose N+ type source region NNS, N+ type drain region NND, and P+ type impurity region BCR, respectively, are then formed on interlayer insulating film DF. Then, contact plug CPS, which is electrically connected to N+ type source region NNS, is formed within contact hole CHS that exposes N+ type source region NNS. Contact plug CPD, which is electrically connected to N+ type drain region NND, is formed within contact hole CHD that exposes N+ type drain region NND. Contact plug CPB, which is electrically connected to P+ type impurity region BCR, is formed within contact hole CHB that exposes N+ type impurity region BCR.

Next, a prescribed conductive film (not shown) is formed on a surface of interlayer insulating film DF. Then, the conductive film is subjected to a prescribed photoengraving process and prescribed processing, thereby forming a metal interconnect MLS electrically connected to contact plug CPS or a metal interconnect MLD electrically connected to contact plug CPD. A metal interconnect MLB electrically connected to contact plug CPB is formed as well. In this way, principal portions of the semiconductor device are formed.

In a semiconductor device with a field effect transistor having a high breakdown voltage, a logic circuit and the like are also formed in addition to the field effect transistor having a high breakdown voltage, on the same semiconductor substrate. For this reason, the steps of ion implantation and the like, for example, are performed simultaneously with the ion implantation step of forming a device such as a logic circuit.

In the semiconductor device with a field effect transistor having a high breakdown voltage described above, N type source region NS is formed only on a region directly below N+ type source region NNS, and not on a region directly below P+ type impurity region BCR. Thus, P+ type impurity region BCR serving as the back gate contact region is in direct contact with P type well PW serving as the back gate region. This suppresses operation of a parasitic bipolar transistor, which allows prevention of junction destruction in the field effect transistor having a high breakdown voltage. This will be explained with a semiconductor device according to a comparative example.

The semiconductor device according to the comparative example has the same structure as that of the semiconductor device shown in FIG. 1 and the like, except that an N type source region (HNS) is formed on both a region directly below N+ type impurity region (NNS) and a region directly below P+ type impurity region (BCR).

As shown in FIGS. 13, 14, 15 and 16, in the semiconductor device according to the comparative example, an N type well JNW is formed in a prescribed region in a P type semiconductor substrate JSUB over a prescribed depth from a surface thereof. An N type drain region JND and a P type well JPW are formed in respective prescribed regions in N type well JNW over a prescribed depth from a surface thereof. An N type source region JNS is formed in P type well JPW over a prescribed depth from a surface thereof.

An N+ type source region JNNS is formed in a portion of N type source region JNS over a prescribed depth from a surface thereof. Moreover, a P+ type impurity region JBCR serving as a back gate contact region is formed in P type well JPW. Furthermore, an N+ type drain region JNND is formed in a portion of N type drain region JND over a prescribed depth from a surface thereof. A gate electrode JG is formed on a portion of P type well JPW and a portion of N type well JNW lying between N type source region JNS and N type drain region JND.

N+ type source region JNNS is electrically connected to a metal interconnect JMLS through a plug JCPS, N+ type drain region JNND is electrically connected to a metal interconnect JMLD through a plug JCPD, and P+ type impurity region JBCR is electrically connected to a metal interconnect through a plug JCPB.

Figure 17:
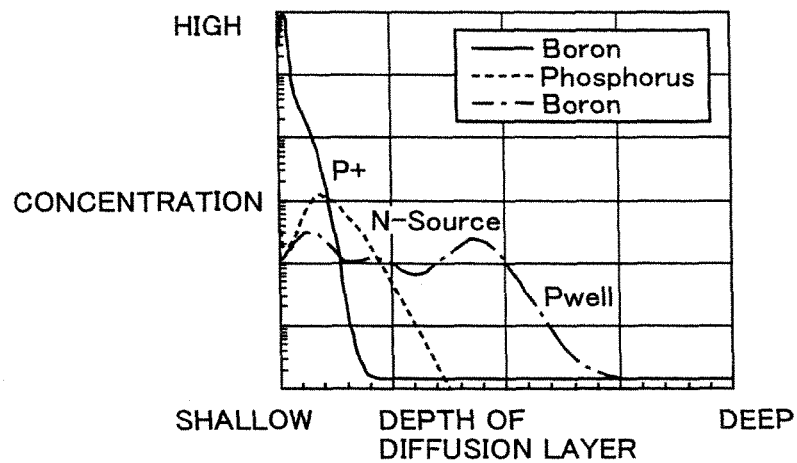
FIG. 17 is a graph showing an impurity concentration profile for illustrating a problem in the semiconductor device according to the comparative example.

In the semiconductor device according to the comparative example, in an ion implantation step of forming N type source region JNS for providing measures against hot carriers and the like, ions are also implanted into the region situated directly below P+ type impurity region JBCR, such that N type source region JNS is formed to surround P+ type impurity region JBCR, in order to ensure a gate width as a field effect transistor having a high breakdown voltage. As shown in FIG. 17, although the impurity concentration of N type source region JNS is lower than that of the P+ type impurity region, N type source region JNS is positioned as a high resistance region between P type impurity region JBCR serving as a back gate contact region and P+ type well JPW serving as a back gate region.

Figure 18:
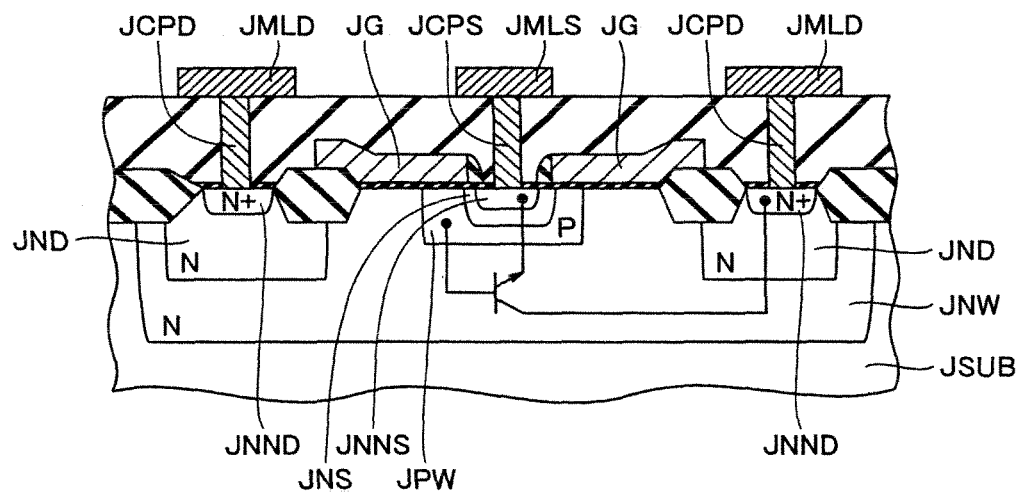
FIG. 18 is a cross-sectional view showing a parasitic bipolar transistor for illustrating the problem in the semiconductor device according to the comparative example.

Thus, even if a voltage of 0 V is applied to P+ type impurity region JBCR in an attempt to fix the potential of P type well PW to 0 V, the potential of P type well PW may float. As shown in FIG. 18, if the potential of P-type well PW floats, a parasitic bipolar transistor may operate in which N type source region NS serves as an emitter, P+ type impurity region BCR as a base, and N type drain region ND as a collector.

Figure 19:
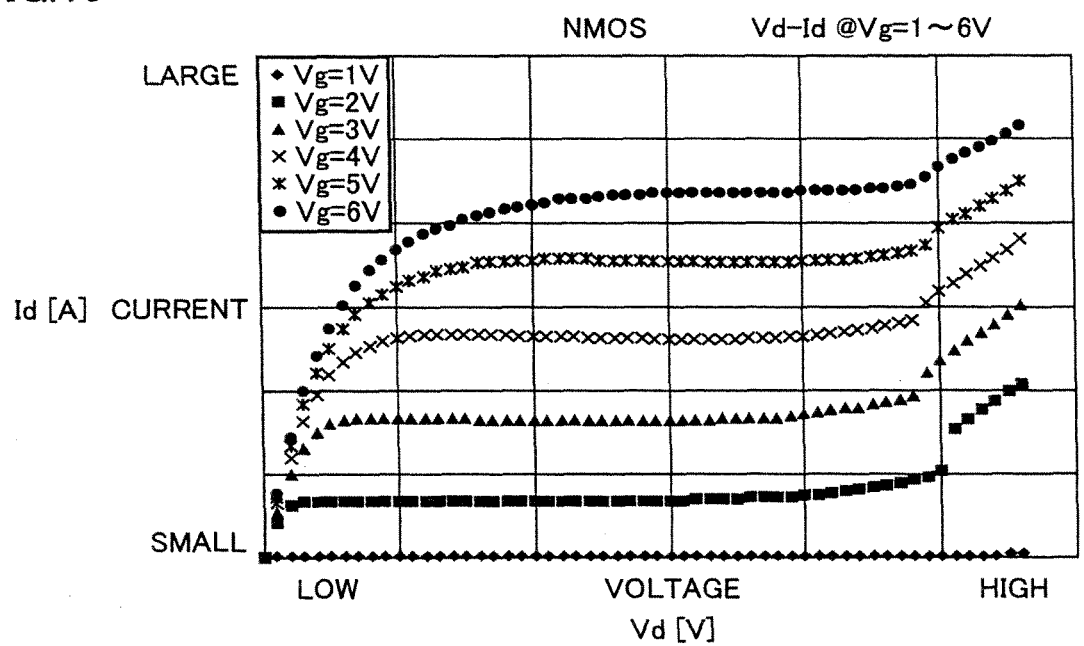
FIG. 19 is a graph showing results of measurement of drain voltage and drain current for illustrating the problem in the semiconductor device according to the comparative example.

That is, as shown in FIG. 19, when the voltage applied to the drain electrode is increased while a prescribed voltage is applied to gate electrode G of the field effect transistor, the parasitic bipolar transistor operates at the point of time when a certain voltage value has exceeded, causing a sharp increase in the drain current. This may result in junction destruction in the field effect transistor.

Figure 20:
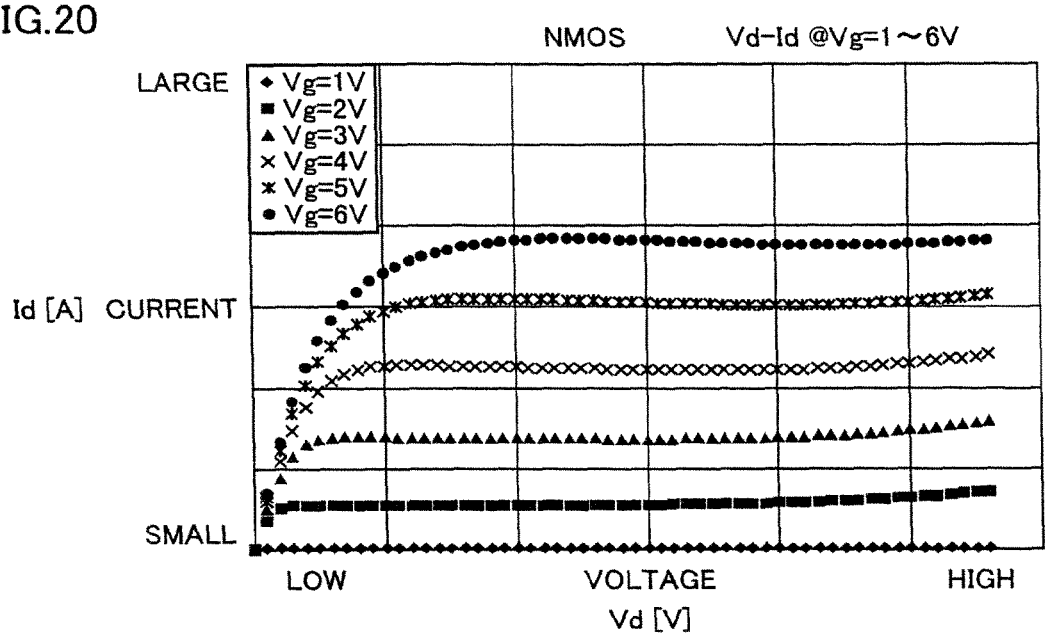
FIG. 20 is a graph showing results of measurement of drain voltage and drain current in the first embodiment.
Figure 21:
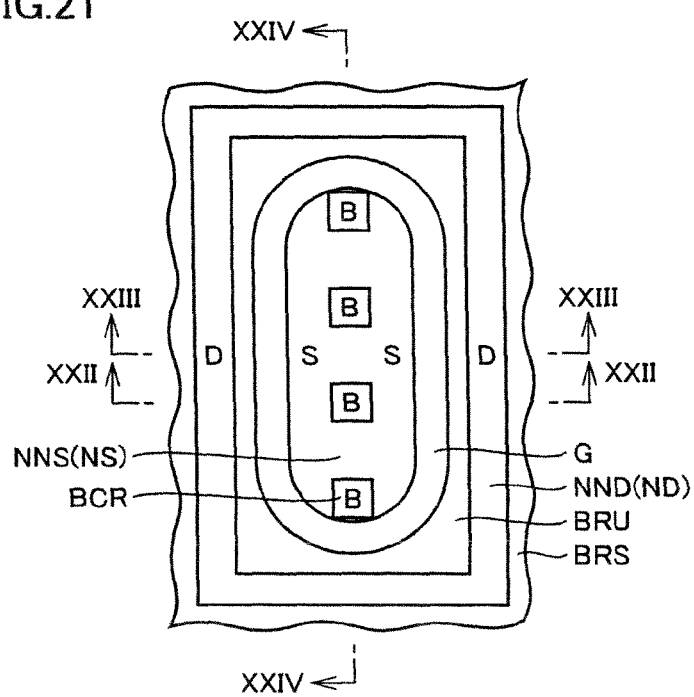
FIG. 21 is a plan view of a semiconductor device according to a second embodiment of the present invention.
Figure 22:
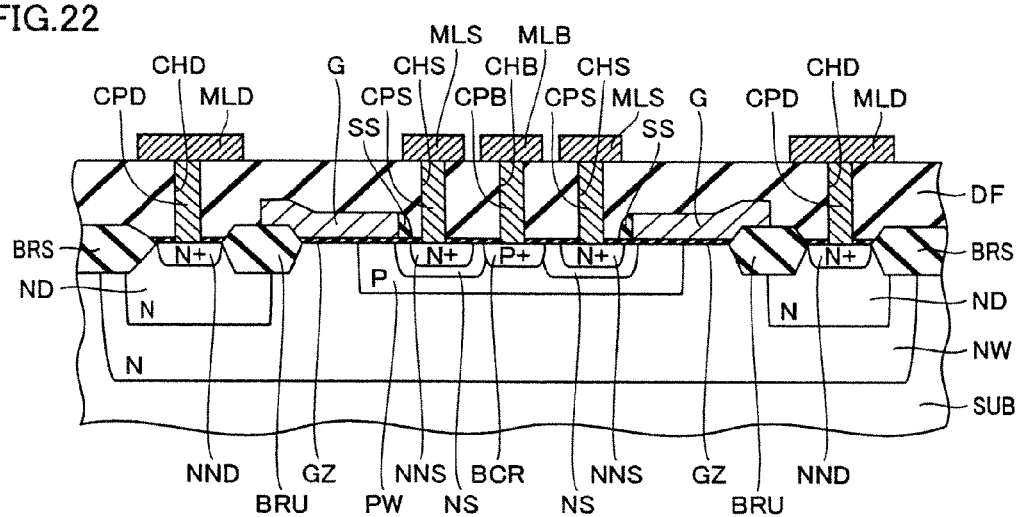
FIG. 22 is a cross-sectional view along a cross-sectional line XXII-XXII shown in FIG. 21 in the second embodiment.
Figure 23:
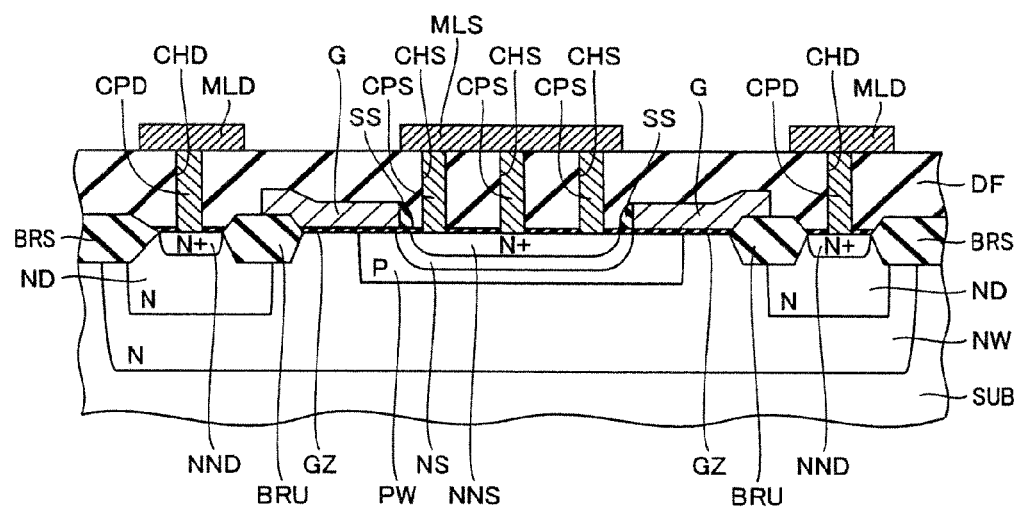
FIG. 23 is a cross-sectional view along a cross-sectional line XXIII-XXIII shown in FIG. 21 in the second embodiment.
Figure 24:
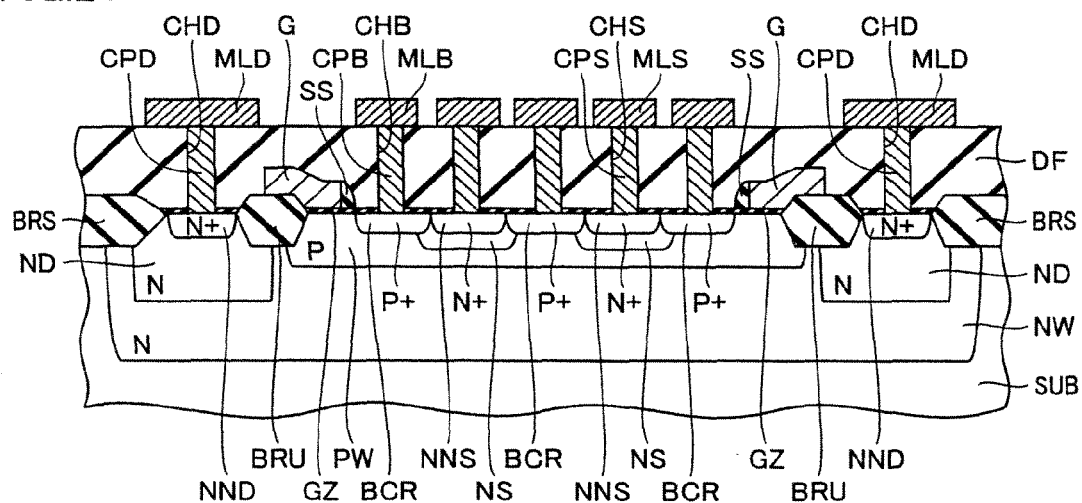
FIG. 24 is a cross-sectional view along a cross-sectional line XXIV-XXIV shown in FIG. 21 in the second embodiment.

In the semiconductor device described above as opposed to the semiconductor device according to the comparative example, N type source region NS is formed only on the region directly below N+ type source region NNS, and not on the region directly below P+ type impurity region BCR. P+ type impurity region BCR serving as the back gate contact region, therefore, is in direct contact with P type well PW serving as the back gate region. Thus, when a voltage of 0 V is applied to P+ type impurity region BCR, the potential of P type well PW is reliably fixed to 0 V without floating. This prevents operation of the parasitic bipolar transistor, as shown in FIG. 20, allowing a sharp increase in the drain current to be suppressed. Consequently, junction destruction in the field effect transistor having a high breakdown voltage can be prevented.

Furthermore, since N type source region NS is formed by the oblique ion implantation, N type source region NS can be widened in the gate width direction to ensure a length over which N type source region NS and N type drain region ND are opposed to each other, as shown in FIGS. 2 and 4. Consequently, deterioration of the current driving capability as a field effect transistor can be suppressed.

Second Embodiment

A second example of a semiconductor device with a high-side field effect transistor will be described herein. As shown in FIGS. 21, 22, 23, and 24, P+ type impurity regions BCR serving as back gate contact regions are formed in P type well PW at a distance from one another in a direction (longitudinal direction) intersecting with (substantially orthogonal to) a direction of current flow. N+ type source region NNS is formed to surround P+ type impurity regions BCR in a planar manner. The "planar manner" means in a layout (two-dimensionally). N type source region NS is formed on a region situated directly below N+ type source region NNS, and not on a region situated directly below P+ type impurity region BCR. Since the semiconductor device is otherwise the same in structure as the semiconductor device shown in FIGS. 2, 3, 4, and 5, identical components are denoted by identical reference characters, and the description thereof will not be repeated.

A method for manufacturing the semiconductor device will be described next. The above-described semiconductor device can be manufactured by basically the same steps as those for the semiconductor device according to the first embodiment, just by changing the arrangement pattern of P+ type impurity regions BCR. That is, N type source region NS, N+ type source region NNS, and P+ type impurity region BCR shown in FIGS. 21, 22, 23, and 24 are formed by performing the steps corresponding to those shown in FIGS. 10 (A), (B), and (C), and the steps corresponding to those shown in FIGS. 11 (A), (B), and (C).

In the semiconductor device described above, since P+ type impurity region BCR is formed in direct contact with P type well PW, the following effect can be achieved in addition to the effect of suppressing operation of the parasitic bipolar transistor.

Specifically, in the semiconductor device described above, N+ type source region NNS is formed to surround P+ type impurity region BCR on side portions thereof, and N type source region NS is formed directly below N+ type source region NNS. This results in an increased length over which N type source region NS and N type drain region ND are opposed to each other, as compared to that in the semiconductor device according to the first embodiment. Consequently, the current driving capability as a field effect transistor can be further enhanced.

Third Embodiment

Figure 25:
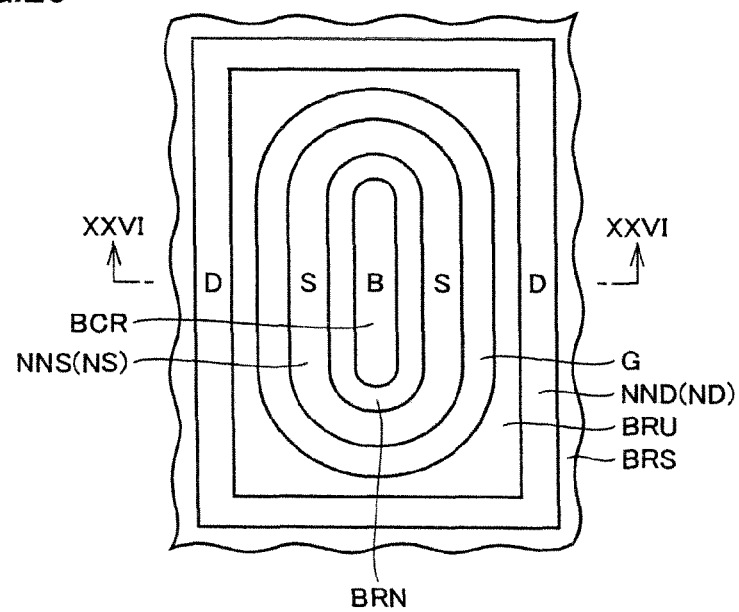
FIG. 25 is a plan view of a semiconductor device according to a third embodiment of the present invention.
Figure 26:
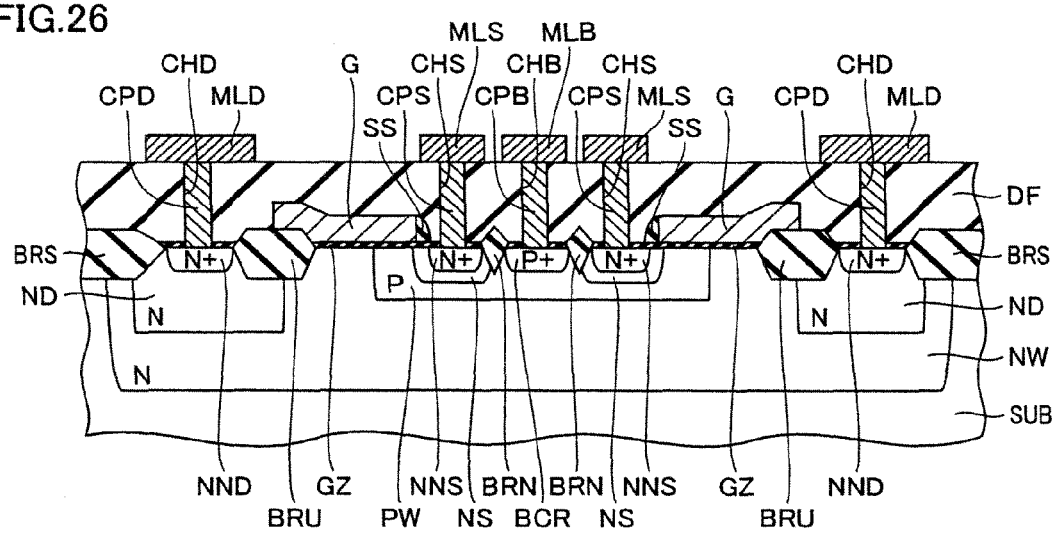
FIG. 26 is a cross-sectional view along a cross-sectional line XXVI-XXVI shown in FIG. 25 in the third embodiment.

A third example of a semiconductor device with a high-side field effect transistor will be described herein. As shown in FIGS. 25 and 26, N+ type source region NNS is formed in P type well PW to surround P+ type impurity region BCR serving as a back gate contact region, and isolation region BRN is formed between P+ type impurity region BCR and N+ type source region NNS. N type source region NS is formed on a region situated directly below type source region NNS, and not on a region situated directly below P+ type impurity region BCR. Since the semiconductor device is otherwise the same in structure as the semiconductor device shown in FIGS. 2, 3, 4, and 5, identical components are denoted by identical reference characters, and the description thereof will not be repeated.

A method for manufacturing the semiconductor device will be described next. The above-described semiconductor device can be manufactured by basically the same steps as those for the semiconductor device according to the first embodiment, just by changing the arrangement pattern of isolation regions.

Figure 27:
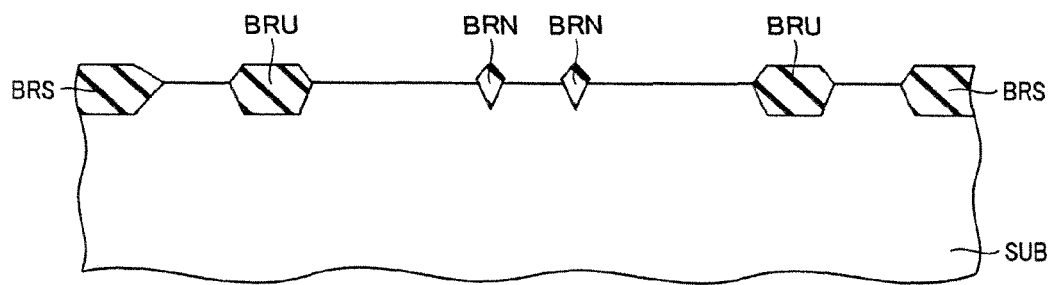
FIG. 27 is a cross-sectional view showing one step of a method for manufacturing the semiconductor device in the third embodiment, and is a cross-sectional view along a cross-sectional line corresponding to cross-sectional line XXVI-XXVI shown in FIG. 25.
Figure 28:
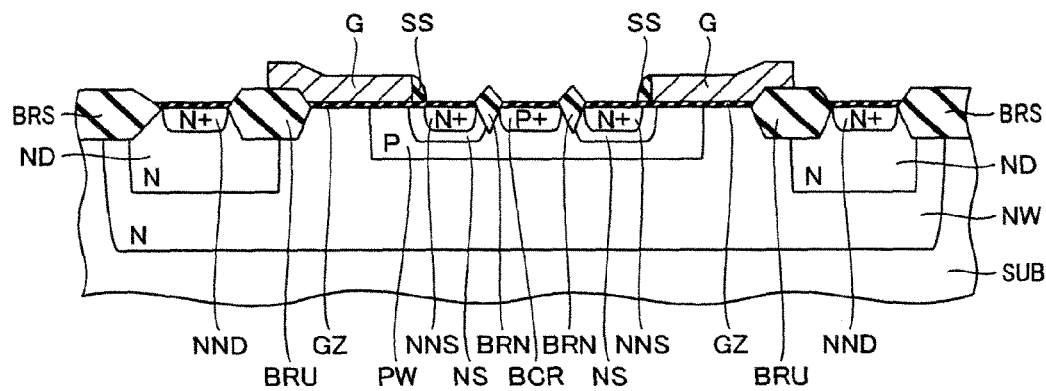
FIG. 28 is a cross-sectional view showing a step performed after the step shown in FIG. 27 in the third embodiment, and is a cross-sectional view along a cross-sectional line corresponding to cross-sectional line XXVI-XXVI shown in FIG. 25.

First, as shown in FIG. 27, isolation regions BRU, BRS, and BRN corresponding to those on the plane pattern shown in FIG. 25 are formed in respective prescribed regions in P type semiconductor substrate SUB. Next, N type source region NS, N+ type source region NNS, P+ type impurity region BCR, and the like are formed, as shown in FIG. 28, by performing the steps corresponding to those shown in FIGS. 7 (A), (B), and (C) to the steps corresponding to those shown in FIGS. 11 (A), (B), and (C).

Figure 29:
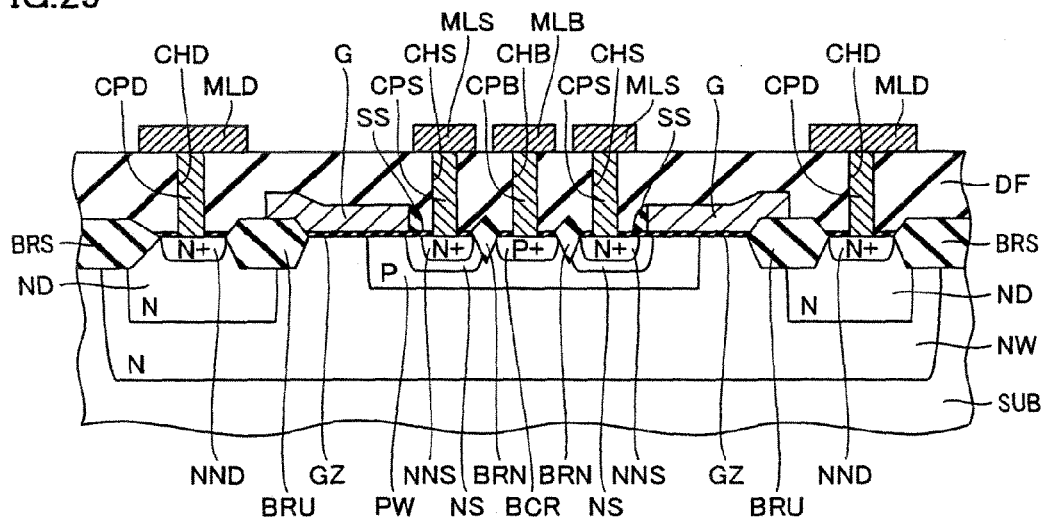
FIG. 29 is a cross-sectional view showing a step performed after the step shown in FIG. 28 in the third embodiment, and is a cross-sectional view along a cross-sectional line corresponding to cross-sectional line XXVI-XXVI shown in FIG. 25.
Figure 30:
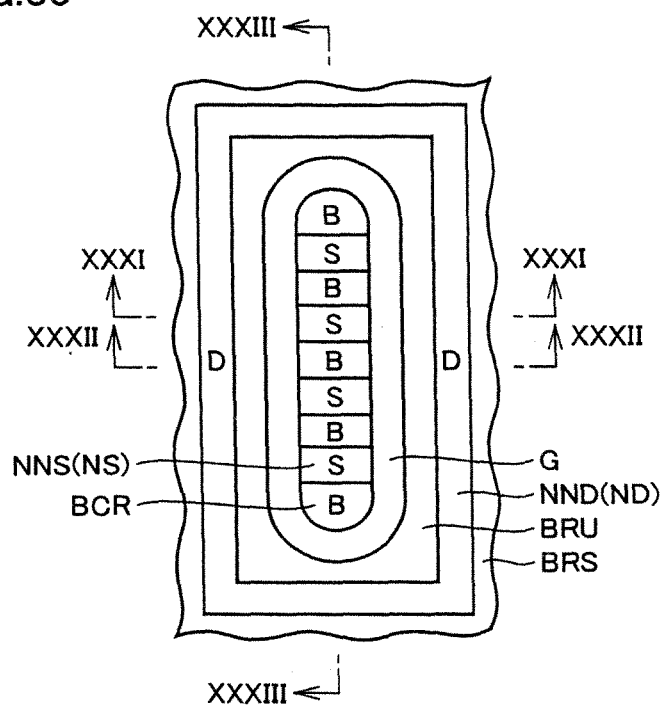
FIG. 30 is a plan view of a semiconductor device according to a fourth embodiment of the present invention.
Figure 31:
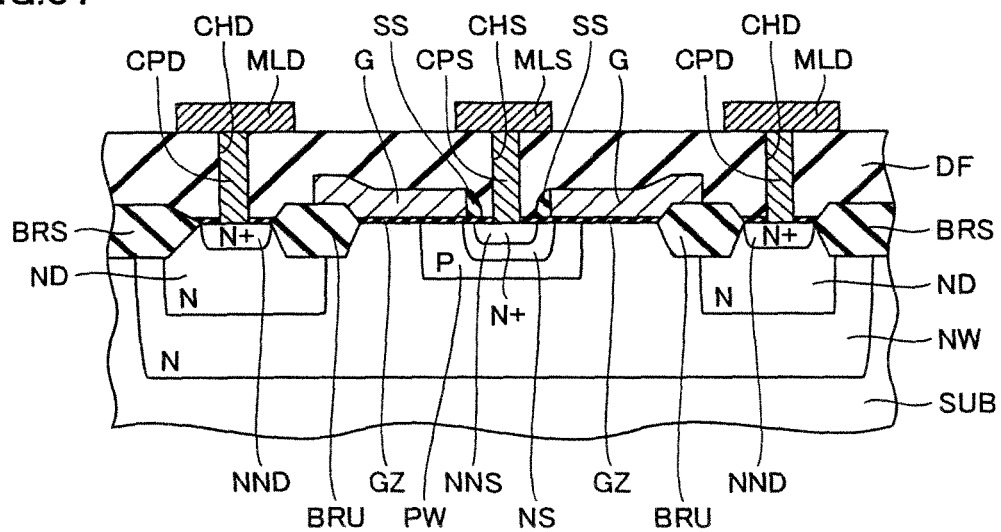
FIG. 31 is a cross-sectional view along a cross-sectional line XXXI-XXXI shown in FIG. 30 in the fourth embodiment.
Figure 32:
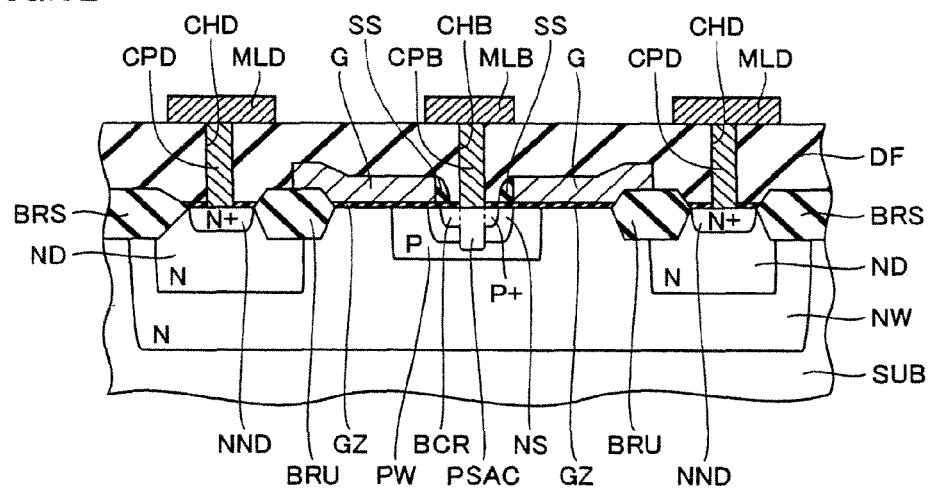
FIG. 32 is a cross-sectional view along a cross-sectional line XXXII-XXXII shown in FIG. 30 in the fourth embodiment.
Figure 33:
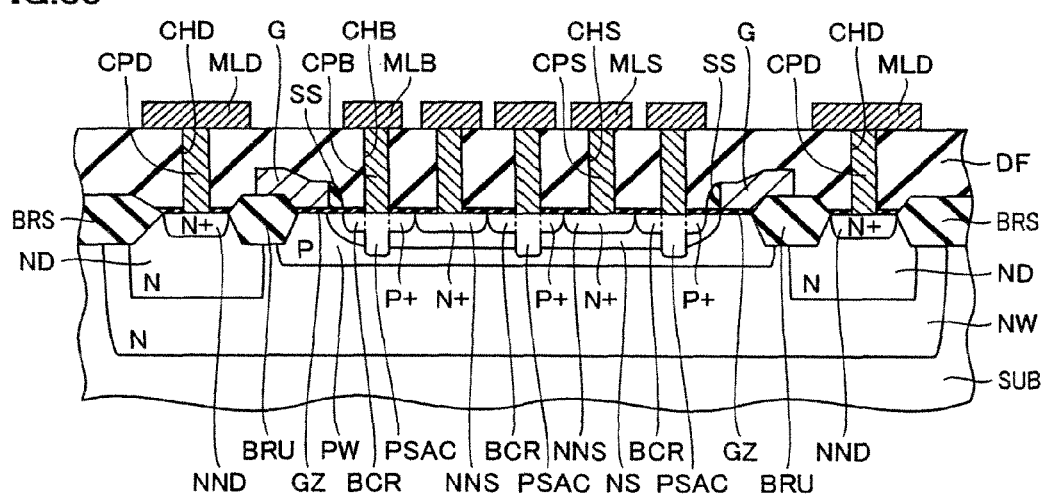
FIG. 33 is a cross-sectional view along a cross-sectional line XXXIII-XXXIII shown in FIG. 30 in the fourth embodiment.

Then, by performing the steps corresponding to those shown in FIGS. 12 (A), (B), and (C), metal interconnect MLS electrically connected to N+ type source region NNS through contact plug CPS, metal interconnect MLD electrically connected to N+ type drain region NND through contact plug CPD, and metal interconnect MLB electrically connected to P+ type impurity region BCR through contact plug CPB are each formed, as shown in FIG. 29.

In the semiconductor device described above, since P+ type impurity region BCR is formed in direct contact with P type well PW, the following effect can be achieved in addition to the effect of suppressing operation of the parasitic bipolar transistor.

Specifically, in the semiconductor device described above, isolation region BRN is formed between P+ type impurity region BCR and N+ type source region NNS. This allows P+ type impurity region BCR and N+ type source region NNS to be electrically isolated from each other, which also enables use in applications where, for example, the voltage (source potential) applied to N+ type source region NNS is allowed to float to a certain level with respect to the voltage (back gate potential) applied to P+ type impurity region BCR.

Fourth Embodiment

A fourth example of a semiconductor device with a high-side field effect transistor will be described herein. As shown in FIGS. 30, 31, 32, and 33, N type source region NS is formed to surround N+ type source region NNS on side and lower portions. Additionally, a P+ type contact implanted region PSAC is formed as a projection that penetrates through N type source region NS to reach P type well PW from N+ type source region NNS. Since the semiconductor device is otherwise the same in structure as the semiconductor device shown in FIGS. 2, 3, 4, and 5, identical components are denoted by identical reference characters, and the description thereof will not be repeated.

A method for manufacturing the semiconductor device will be described next. First, gate electrode G is formed as shown in FIGS. 34 (A), (B), and (C), by performing the steps corresponding to those shown in FIGS. 6 (A), (B), and (C) the steps corresponding to those shown in FIGS. 9 (A), (B), and (C). Next, a photoresist (not shown) is formed to expose a region on which P+ type impurity region BCR (see FIG. 33) is to be formed and a region on which N+ type source region NNS (see FIG. 33) is to be formed, of an exposed portion of P type well PW that is not covered with gate electrode G.

Then, with the photoresist used as a mask, phosphorus, for example, is implanted obliquely at an inclined angle of about 45° with respect to a surface of semiconductor substrate SUB, thereby forming N type source region NS over a prescribed depth from a surface of exposed P type well PW, as shown in FIGS. 35 (A), (B), and (C). The photoresist is subsequently removed. Next, an insulating film spacer SS is formed on a side wall of gate electrode G, as shown in FIGS. 36 (A), (B), and (C), by performing the steps corresponding to those shown in FIGS. 11 (A), (B), and (C). Additionally, N+ type source region NNS and P+ type impurity region BCR are each formed in N type source region NS over a prescribed depth from a surface thereof. N+ type drain region NND is also formed in N type drain region ND over a prescribed depth from a surface thereof.

Next, as shown in FIGS. 37 (A), (B) and (C), interlayer insulating film DP is formed on semiconductor substrate SUB to cover gate electrode G and the like. Contact holes CHS, CHD and CHB that expose N+ type source region NNS, N+ type drain region NND, and P+ type impurity region BCR, respectively, are then formed on interlayer insulating film DF.

Figure 38:
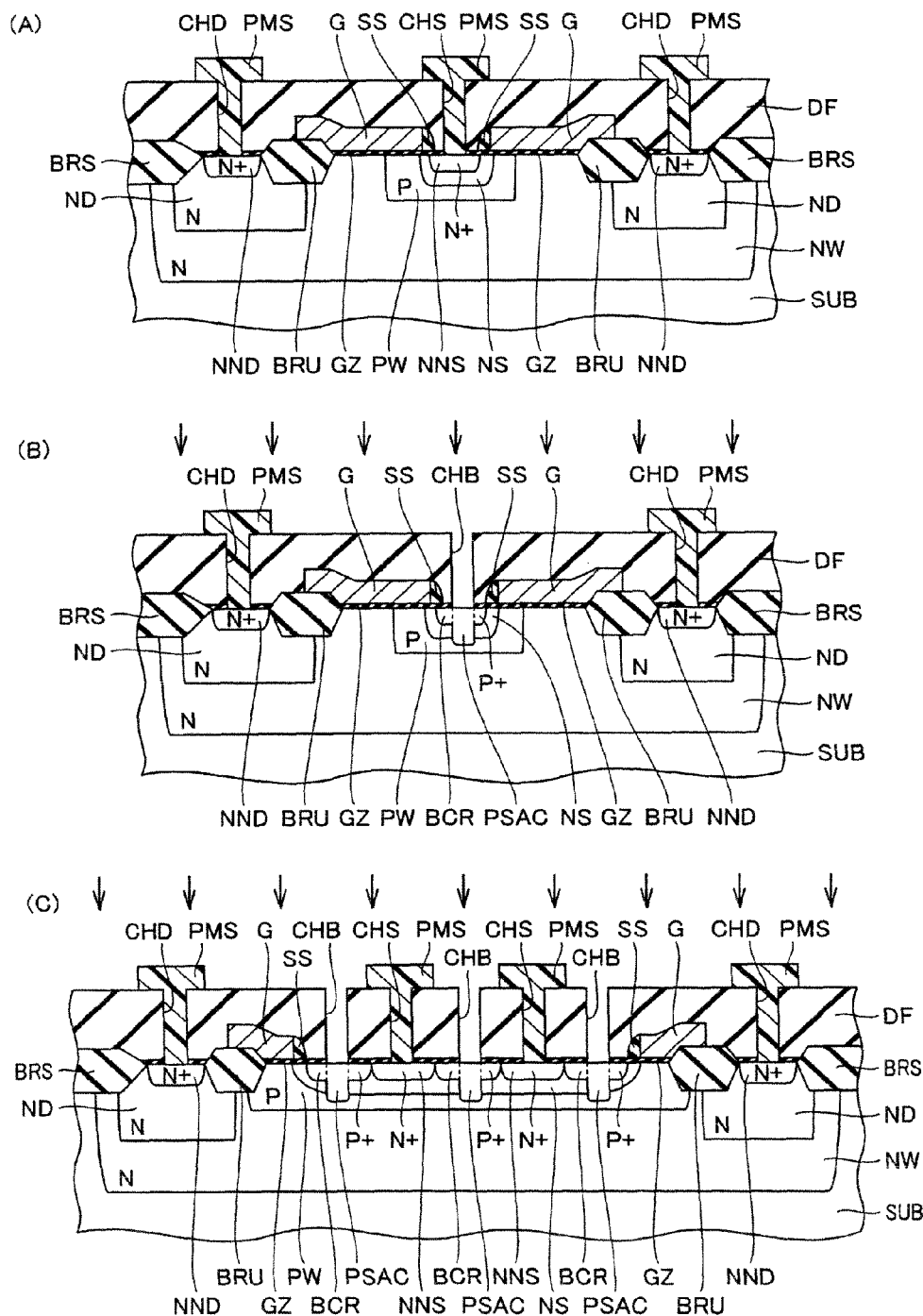
FIGS. 38 (A) to (C) are cross-sectional views showing a step performed after the step shown in FIG. 37 in the fourth embodiment, wherein FIG. 38 (A) is a cross-sectional view along a cross-sectional line corresponding to cross-sectional line XXXI-XXXI shown in FIG. 30, FIG. 38 (B) is a cross-sectional view along a cross-sectional line corresponding to cross-sectional line XXXII-XXXII shown in FIG. 30, and FIG. 38 (C) is a cross-sectional view along a cross-sectional line corresponding to cross-sectional line XXXIII-XXXIII shown in FIG. 30.

Then, as shown in FIGS. 38 (A), (B), and (C), other contact holes CHS and CHD are covered with a photoresist PMS while leaving contact hole CHB that exposes P+ type impurity region BCR. Next, with photoresist PMS used as a mask, boron is implanted at a prescribed energy into P+ type impurity region BCR through contact hole CHB, thereby forming P+ type contact implanted region PSAC that reaches P type well PW from P+ type impurity region BCR. P+ type contact implanted region PSAC has an impurity concentration of approximately $5 \times 10^{18}/cm^3$.

Figure 39:
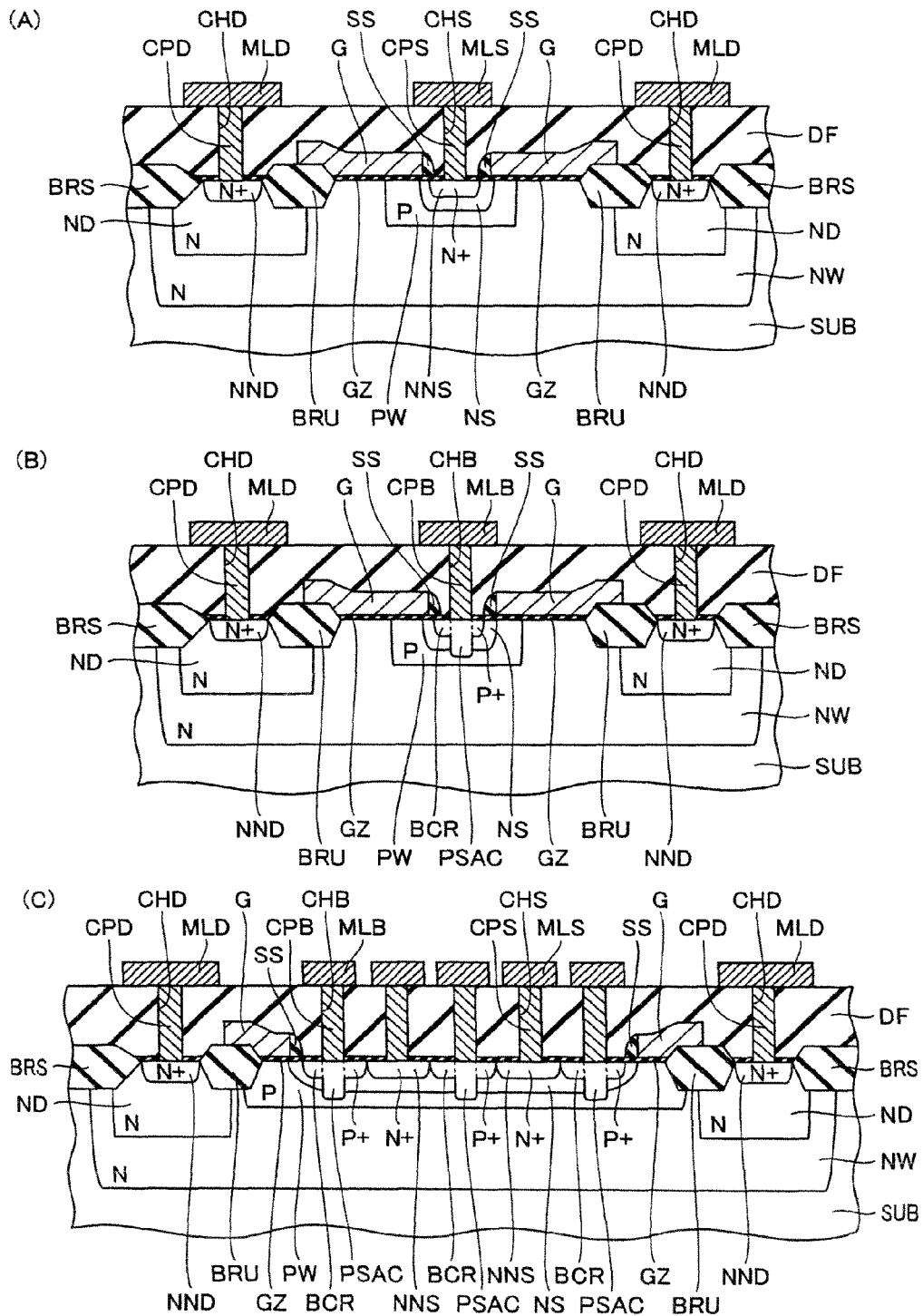
FIGS. 39 (A) to (C) are cross-sectional views showing a step performed after the step shown in FIG. 38 in the fourth embodiment, wherein FIG. 39 (A) is a cross-sectional view along a cross-sectional line corresponding to cross-sectional line XXXI-XXXI shown in FIG. 30, FIG. 39 (B) is a cross-sectional view along a cross-sectional line corresponding to cross-sectional line XXXII-XXXII shown in FIG. 30, and FIG. 39 (C) is a cross-sectional view along a cross-sectional line corresponding to cross-sectional line XXXIII-XXXIII shown in FIG. 30.
Figure 40:
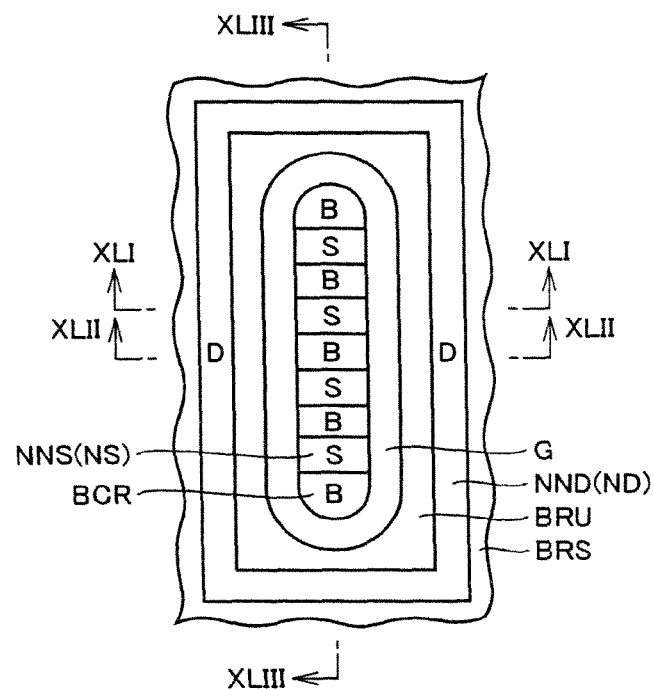
FIG. 40 is a plan view of a semiconductor device according to a fifth embodiment of the present invention.
Figure 41:
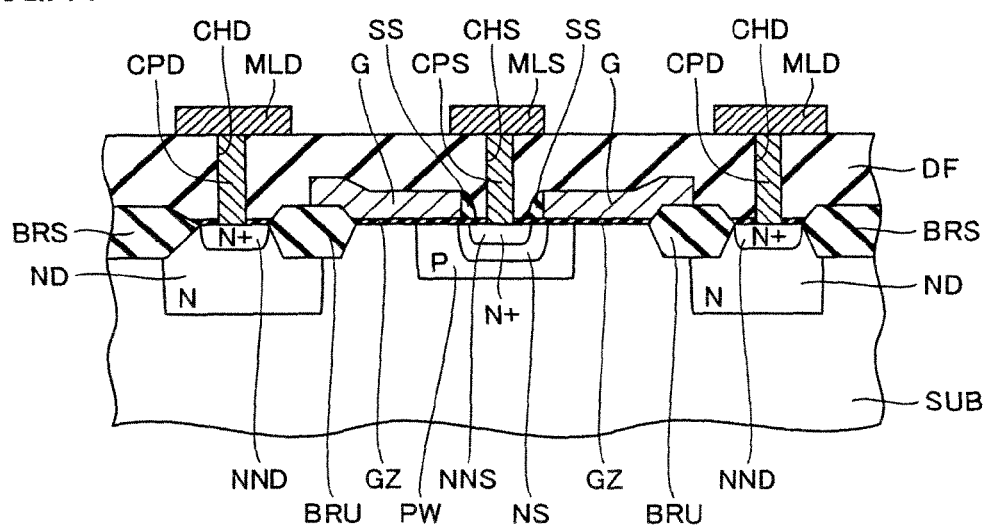
FIG. 41 is a cross-sectional view along a cross-sectional line XLI-XLI shown in FIG. 40 in the fifth embodiment.
Figure 42:
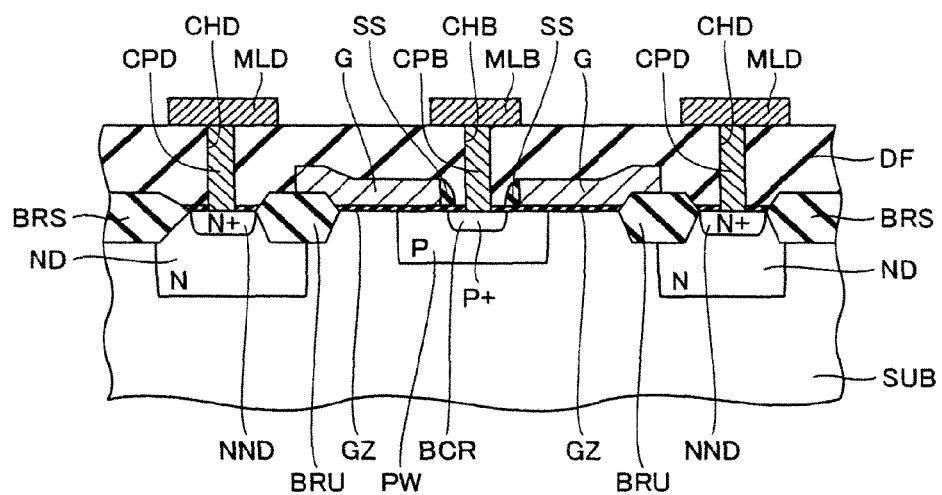
FIG. 42 is a cross-sectional view along a cross-sectional line XLII-XLII shown in FIG. 40 in the fifth embodiment.
Figure 43:
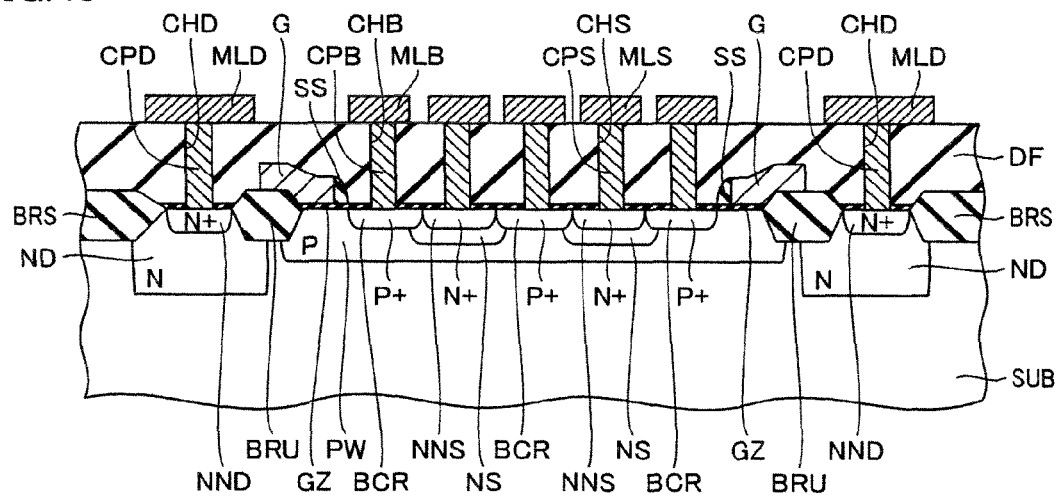
FIG. 43 is a cross-sectional view along a cross-sectional line XLIII-XLIII shown in FIG. 40 in the fifth embodiment.
Figure 44:
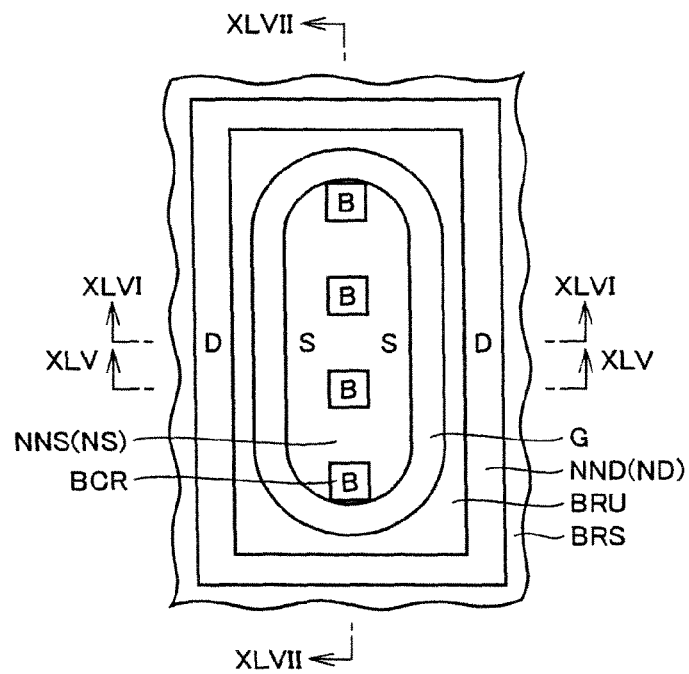
FIG. 44 is a plan view of a semiconductor device according to a sixth embodiment of the present invention.
Figure 45:
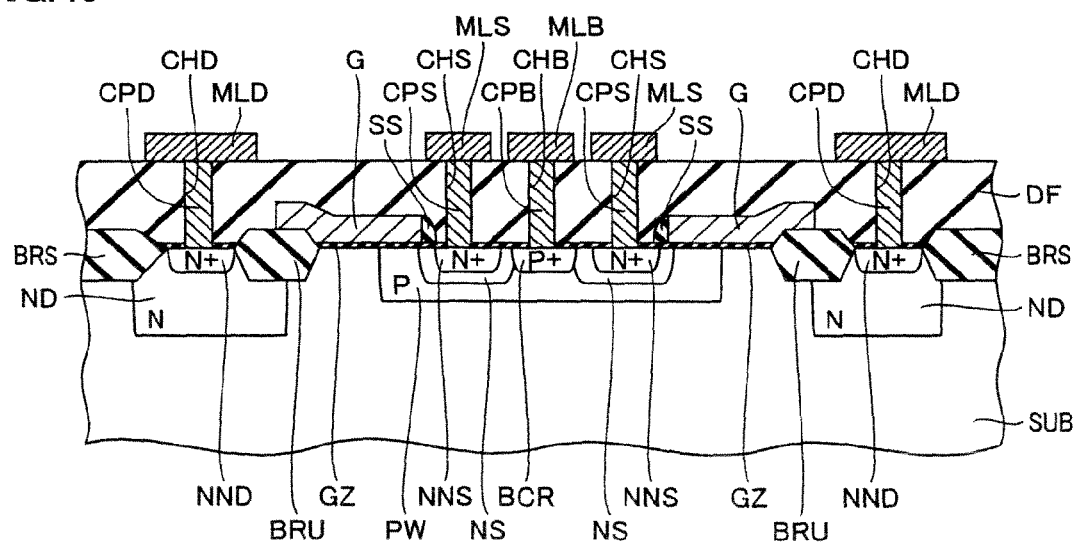
FIG. 45 is a cross-sectional view along a cross-sectional line XLV-XLV shown in FIG. 44 in the sixth embodiment.
Figure 46:
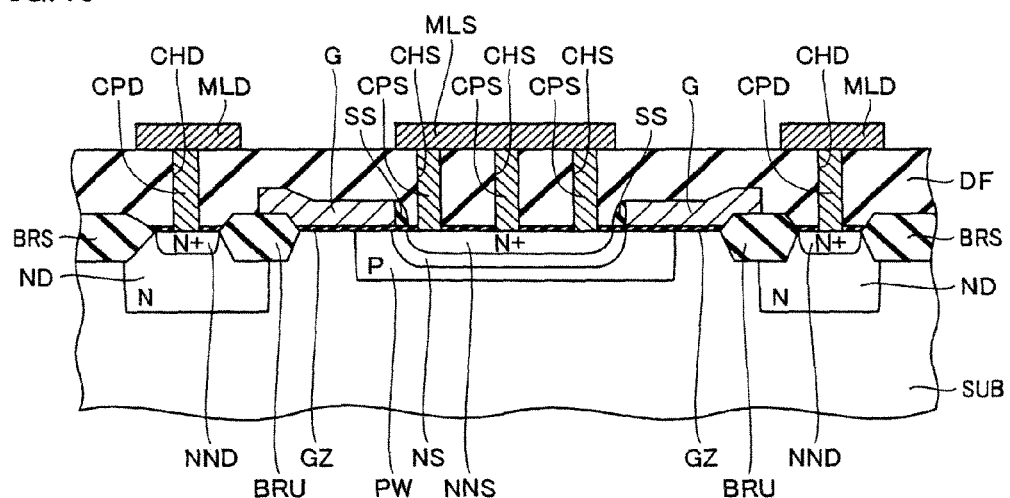
FIG. 46 is a cross-sectional view along a cross-sectional line XLVI-XLVI shown in FIG. 44 in the sixth embodiment.
Figure 47:
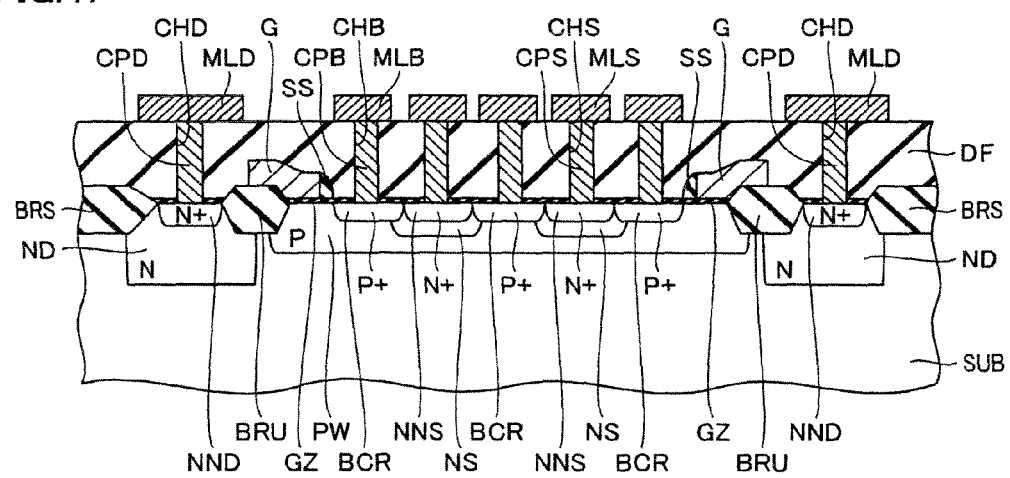
FIG. 47 is a cross-sectional view along a cross-sectional line XLVII-XLVII shown in FIG. 44 in the sixth embodiment.

Then, by performing the steps corresponding to those shown in FIGS. 12 (A), (B), and (C), metal interconnect MLS electrically connected to N+ type source region NNS through contact plug CPS, metal interconnect MLD electrically connected to N+ type drain region NND through contact plug CPD, and metal interconnect MLB electrically connected to P+ type impurity region BCR through contact plug CPB are each formed, as shown in FIGS. 39 (A), (B), and (C).

In the semiconductor device described above, since N type impurity region BCR is electrically connected to P type well PW through P+ type contact implanted region PSAC, the following effect can be achieved in addition to the effect of suppressing operation of the parasitic bipolar transistor.

Specifically, in the semiconductor device described above, N type source region NS is formed on the side and lower portions of P+ type impurity region BCR, except for the portion where P+ type contact implanted region PSAC is positioned. This results in an increased length over which N type source region NS and N type drain region ND are opposed to each other, as compared to that in the semiconductor device described in the first embodiment. Consequently, the current driving capability of the field effect transistor can be further enhanced.

Fifth Embodiment

A first example of a semiconductor device with a low-side field effect transistor will be described herein. As shown in FIGS. 40, 41, 42, and 43, since the semiconductor device according to this embodiment is the same in structure as that shown in FIGS. 2, 3, 4, and 5, except that N type well NW (see FIG. 2 and the like) is not formed, identical components are denoted by identical reference characters, and the description thereof will not be repeated.

A method for manufacturing the semiconductor device described above will be described next. The above-described semiconductor device is manufactured without performing the step of forming N type well NW, of a series of the manufacturing steps described in the first embodiment. That is, the semiconductor device is manufactured by performing the steps shown in FIGS. 6 (A), (B), and (C), and then performing the steps shown in FIGS. 8 (A), (B), and (C) to the steps shown in FIGS. 12 (A), (B), and (C).

In the semiconductor device described above, P+ type impurity region BCR is formed in direct contact with P type well PW, and P type well PW, in turn, is in direct contact with P type semiconductor substrate SUB, so that the potential of P type well PW is stabilized, which allows operation of a parasitic bipolar transistor to be suppressed. The structure of this semiconductor device is particularly advantageous where it is not necessary to electrically isolate P type well PW from semiconductor substrate SUB.

Sixth Embodiment

A second example of a semiconductor device with a low-side field effect transistor will be described herein. As shown in FIGS. 44, 45, 46, and 47, since the semiconductor device according to this embodiment is the same in structure as that shown in FIGS. 21, 22, 23, and 24, except that N type well NW (see FIG. 1 and the like) is not formed, identical components are denoted by identical reference characters, and the description thereof will not be repeated.

A method for manufacturing the semiconductor device described above will be described next. The above-described semiconductor device is manufactured without performing the step of forming N type well NW, of the manufacturing steps described in the second embodiment.

In the semiconductor device described above, P+ type impurity region BCR is formed in direct contact with P type well PW, and P type well PW, in turn, is in direct contact with P type semiconductor substrate SUB, so that the potential of P type well PW is stabilized, which allows operation of a parasitic bipolar transistor to be suppressed.

Moreover, as described in the second embodiment, N+ type source region NNS is formed to surround P+ type impurity region BCR on side portions thereof, and N type source region NS is formed directly below N+ type source region NNS. This results in an increased length over which N type source region NS and N type drain region ND are opposed to each other, as compared to that in the semiconductor device according to the fifth embodiment. Consequently, the current driving capability as a field effect transistor can be further enhanced. The structure of this semiconductor device is particularly advantageous where it is not necessary to electrically isolate P type well PW from semiconductor substrate SUB.

Seventh Embodiment

Figure 48:
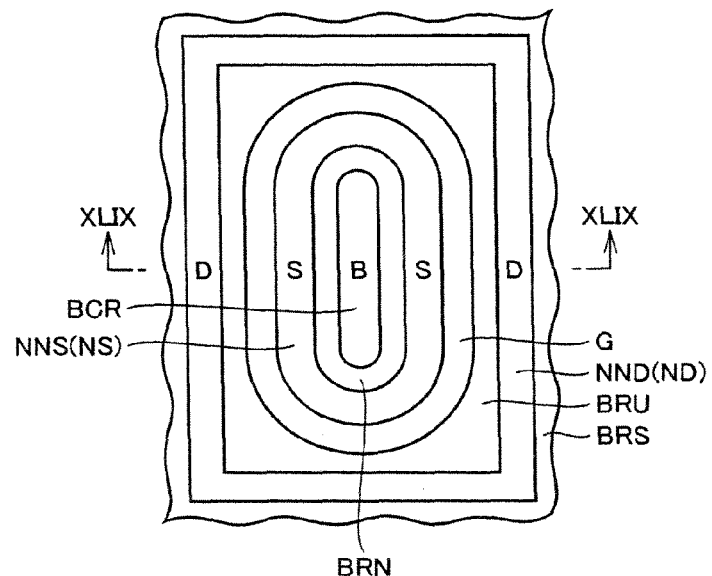
FIG. 48 is a plan view of a semiconductor device according to a seventh embodiment of the present invention.
Figure 49:
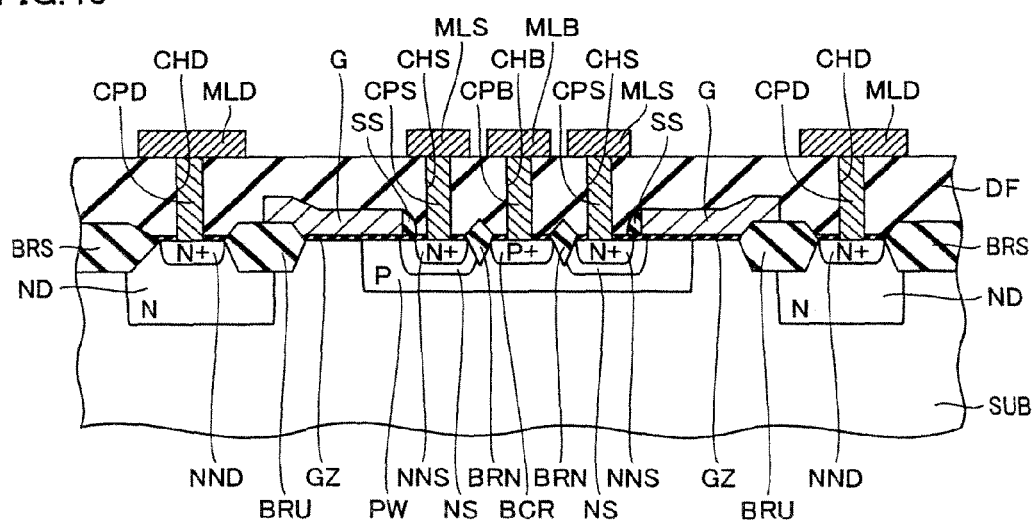
FIG. 49 is a cross-sectional view along a cross-sectional line XLIX-XLIX shown in FIG. 48 in the seventh embodiment.
Figure 50:
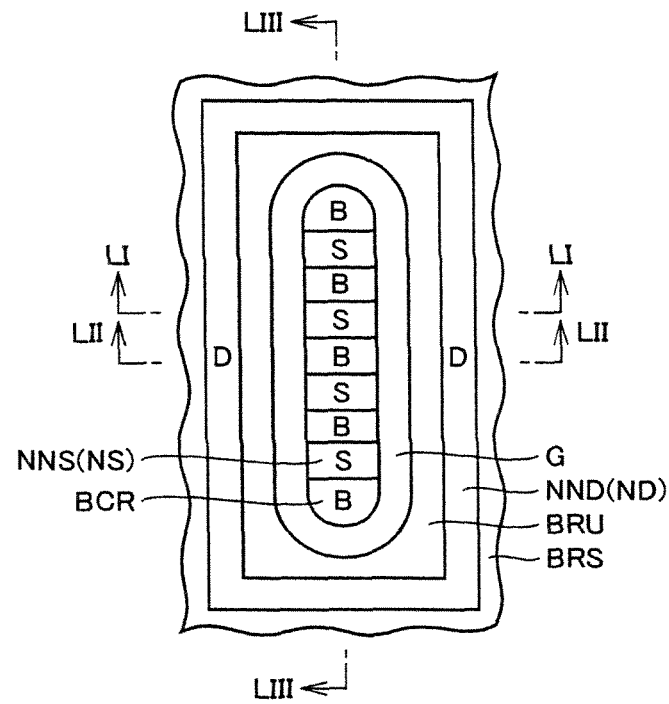
FIG. 50 is a plan view of a semiconductor device according to an eighth embodiment of the present invention.
Figure 51:
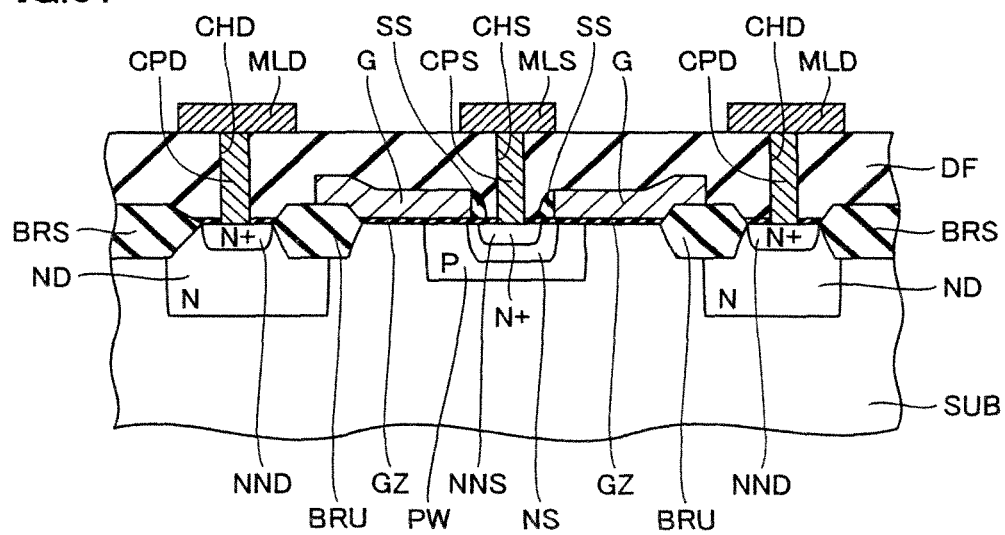
FIG. 51 is a cross-sectional view along a cross-sectional line LI-LI shown in FIG. 50 in the eighth embodiment.
Figure 52:
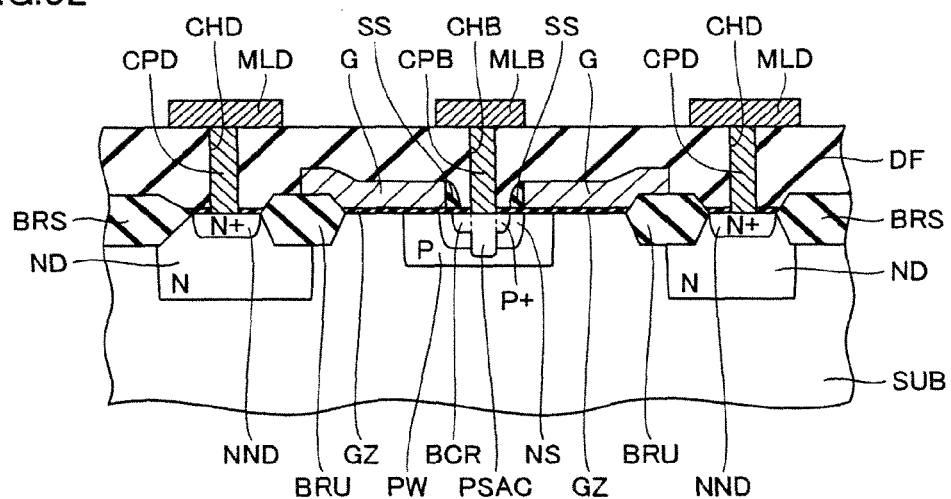
FIG. 52 is a cross-sectional view along a cross-sectional line LII-LII shown in FIG. 50 in the eighth embodiment.
Figure 53:
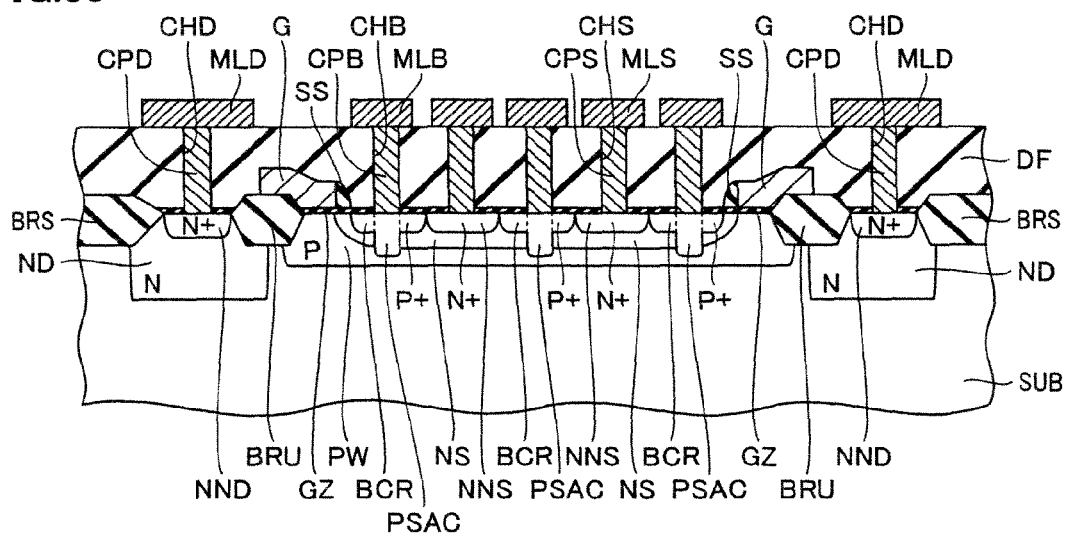
FIG. 53 is a cross-sectional view along a cross-sectional line LIII-LIII shown in FIG. 50 in the eighth embodiment.

A third example of a semiconductor device with a low-side field effect transistor will be described herein. As shown in FIGS. 48 and 49, since the semiconductor device according to this embodiment is the same in structure as that shown in FIGS. 25 and 26, except that N type well NW (see FIG. 1 and the like) is not formed, identical components are denoted by identical reference characters, and the description thereof will not be repeated.

A method for manufacturing the semiconductor device described above will be described next. The above-described semiconductor device is manufactured without performing the step of forming N type well NW, of a series of the manufacturing steps described in the third embodiment.

In the semiconductor device described above, P+ type impurity region BCR is formed in direct contact with P type well PW, and P type well PW, in turn, is in direct contact with P type semiconductor substrate SUB, so that the potential of P type well PW is stabilized, which allows operation of a parasitic bipolar transistor to be suppressed.

Moreover, as described in the third embodiment, in the above-described semiconductor device, isolation region BRN is formed between P+ type impurity region BCR and N+ type source region NNS. This allows P+ type impurity region BCR and N+ type source region NNS to be electrically isolated from each other, which also enables use in applications where, for example, the voltage (source potential) applied to N+ type source region NNS is allowed to float to a certain level with respect to the voltage (back gate potential) applied to P+ type impurity region BCR.

Eighth Embodiment

A fourth example of a semiconductor device with a low-side field effect transistor will be described herein. As shown in FIGS. 50, 51, 52 and 53, since the semiconductor device according to this embodiment is the same in structure as that shown in FIGS. 30, 31, 32 and 33, except that N type well NW (see FIG. 2 and the like) is not formed, identical components are denoted by identical reference characters, and the description thereof will not be repeated.

A method for manufacturing the semiconductor device described above will be described next. The above-described semiconductor device is manufactured without performing the step of forming N type well NW, of a series of the manufacturing steps described in the fourth embodiment.

In the semiconductor device described above, P+ type impurity region BCR is formed in direct contact with P type well PW, and P type well PW, in turn, is in direct contact with P type semiconductor substrate SUB, so that the potential of P type well PW is stabilized, which allows operation of a parasitic bipolar transistor to be suppressed.

Furthermore, as described in the fourth embodiment, in the above-described semiconductor device, N type source region NS is formed on side and lower portions of P+ type impurity region BCR, except for the portion where P+ type contact implanted region PSAC is positioned. This results in an increased length over which N type source region NS and N type drain region ND are opposed to each other, as compared to that in the semiconductor device described in the first embodiment. Consequently, the current driving capability of the field effect transistor can be further enhanced.

While each of the foregoing embodiments has individually described high-side N type field effect transistors with high breakdown voltages and low-side N type field effect transistors with high breakdown voltages, a semiconductor device may include a high-side N type field effect transistor having a high breakdown voltage and a low-side N type field effect transistor having a high breakdown voltage mounted on the same Substrate. An isolation region rimy also be a trench isolation insulating film, instead of an insulating film formed by the LOCOS method.

The embodiments disclosed herein are illustrative and not restrictive. The scope of the present invention is defined by the terms of the claims, rather than by the foregoing description, and is intended to include any modifications within the scope and meaning equivalent to the terms of the claims.

INDUSTRIAL APPLICABILITY

The present invention is effectively used as a semiconductor device with a field effect transistor having a high breakdown voltage for controlling a power supply, for example.

REFERENCE SIGNS LIST

SUB: semiconductor substrate; BRU: isolation region; BRS: isolation region; BRN: isolation region; NW: N type well; ND: N type drain region; PW: P type well; GZ: gate insulating film; G: gate electrode; NS: N type source region; SS: insulating film spacer; NND: N+ type drain region; NNS: N+ type source region; BCR: type impurity region; CPS: contact plug; CPD: contact plug; CPB: contact plug; PSAC: P+ type contact implanted region, DF: interlayer insulating film; CHS: contact hole; CHD: contact hole; CHB: contact hole; MLS: metal interconnect; MLD: metal interconnect; MLB: metal interconnect; TNH: field effect transistor; TNL: field effect transistor; PM: photoresist mask; PMS: photoresist mask.

The invention claimed is:

1. A semiconductor device comprising:
a semiconductor substrate of a first conductivity type having a main surface;
a first impurity region of the first conductivity type formed over a prescribed depth from said main surface of said semiconductor substrate, and having a first impurity concentration;
a second impurity region of a second conductivity type formed over a prescribed depth from a surface of said first impurity region to be surrounded by said first impurity region on side and lower portions, and having a second impurity concentration;
a third impurity region of the second conductivity type formed over a prescribed depth from a surface of said second impurity region to be surrounded by said second impurity region on side and lower portions, and having a third impurity concentration higher than said second impurity concentration;
a fourth impurity region of the first conductivity type formed over a prescribed depth from the surface of said first impurity region to be surrounded by said first impurity region on side and lower portions, and having a fourth impurity concentration higher than said first impurity concentration;
an isolation region formed between said third impurity region and said fourth impurity region to electrically isolate said third impurity region and said fourth impurity region from each other;
a fifth impurity region of the second conductivity type formed over a prescribed depth from said main surface of said semiconductor substrate at a distance from said first impurity region, and having a fifth impurity concentration;
a seventh impurity region of the second conductivity type formed over a prescribed depth from a surface of the fifth impurity region and surrounded by the fifth impurity region on side and lower portions, and having a seventh impurity concentration higher than the fifth impurity concentration; and
an electrode portion formed on a region lying between said second impurity region and said fifth impurity region.

2. The semiconductor device according to claim 1, comprising:
a sixth impurity region of the second conductivity type formed over a prescribed depth from said main surface of said semiconductor substrate to surround said first impurity region and said fifth impurity region on side and lower portions.

3. The semiconductor device according to claim 1, wherein the seventh impurity region is a drain region, and the third impurity region is a source region.

* * * * *